US011750025B2

(12) United States Patent
Binder et al.

(10) Patent No.: US 11,750,025 B2
(45) Date of Patent: *Sep. 5, 2023

(54) CIRCUIT FOR A POWER DEVICE AND GRAPHICAL USER INTERFACE

(71) Applicant: Solaredge Technologies Ltd., Herzeliya (IL)

(72) Inventors: Yaron Binder, Shoham (IL); Lior Handelsman, Givatayim (IL); Ilan Yoscovich, Givatayim (IL); Guy Sella, Bitan Aharon (IL); Menashe Walsh, Modi'in Illit (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/069,327

(22) Filed: Dec. 21, 2022

(65) Prior Publication Data

US 2023/0163628 A1 May 25, 2023

Related U.S. Application Data

(63) Continuation of application No. 15/991,495, filed on May 29, 2018, now Pat. No. 11,569,683.
(Continued)

(51) Int. Cl.
*H02J 13/00* (2006.01)
*G05F 5/00* (2006.01)
(Continued)

(52) U.S. Cl.
CPC ...... *H02J 13/00017* (2020.01); *G01R 15/125* (2013.01); *G05B 15/02* (2013.01);
(Continued)

(58) Field of Classification Search
CPC ........ H02J 13/0096; H02J 3/381; H02J 13/00; H02J 3/383; G05B 15/02; G06F 3/04847; G06F 3/14; G05F 5/00; G01R 15/125
See application file for complete search history.

(56) References Cited

U.S. PATENT DOCUMENTS

| 6,886,114 B2 | 4/2005 | Parry |
| 8,452,461 B2 | 5/2013 | Sawyer et al. |

(Continued)

FOREIGN PATENT DOCUMENTS

| JP | 2016038816 A | 3/2016 |
| JP | 2016103114 A | 6/2016 |

(Continued)

OTHER PUBLICATIONS

Ryoichi Hara, Testing the Technologies: Demonstration Grid-Connected Photovoltaic Projects in Japan, Jul. 2009, IEEE Magazine (Year: 2009).

(Continued)

*Primary Examiner* — Robert E Fennema
*Assistant Examiner* — Christopher W Carter
(74) *Attorney, Agent, or Firm* — Banner & Witcoff, Ltd.

(57) ABSTRACT

An apparatus for a system power device utilized in an interconnected power system. The interconnected power system may include multiple system power devices connected to various inter connections of groups of direct currents (DC) from power sources which also may be connected in various series, parallel, series parallel and parallel series combinations for example. The apparatus may include a processor connected to a memory and a communication interface operatively attached to the processor. The communication interface may be adapted to connect to a mobile computing system of a user in close proximity to the system power devices. A graphical user interface (GUI) of (Continued)

the mobile computing system may allow various operational and re-configuration options for the interconnected power system which may include installation, maintenance and monitoring schedules in the interconnected power system when the user of the GUI is in close proximity to the system power devices.

20 Claims, 8 Drawing Sheets

Related U.S. Application Data

(60) Provisional application No. 62/513,054, filed on May 31, 2017.

(51) Int. Cl.
  *G01R 15/12*   (2006.01)
  *G06F 3/04847*   (2022.01)
  *G06F 3/14*   (2006.01)
  *G05B 15/02*   (2006.01)
  *H02J 3/38*   (2006.01)
  *H02J 3/46*   (2006.01)

(52) U.S. Cl.
  CPC ............ *G05F 5/00* (2013.01); *G06F 3/04847* (2013.01); *G06F 3/14* (2013.01); *H02J 3/381* (2013.01); *H02J 13/00* (2013.01); *H02J 13/00002* (2020.01); *H02J 3/388* (2020.01); *H02J 3/466* (2020.01); *H02J 2300/24* (2020.01)

(56) References Cited

U.S. PATENT DOCUMENTS

| | | |
|---|---|---|
| 2006/0267792 A1 | 11/2006 | Schnaare et al. |
| 2008/0147335 A1 | 6/2008 | Adest et al. |
| 2009/0065578 A1 | 3/2009 | Peterson et al. |
| 2010/0138771 A1 | 6/2010 | Kumar et al. |
| 2011/0143661 A1 | 6/2011 | Hartwig et al. |
| 2011/0172842 A1 | 7/2011 | Makhota et al. |
| 2013/0346054 A1 | 12/2013 | Mumtaz |
| 2014/0049117 A1 | 2/2014 | Rahman |
| 2014/0111006 A1 | 4/2014 | Baldassarre et al. |
| 2017/0090446 A1 | 3/2017 | Chan et al. |
| 2017/0141610 A1 | 5/2017 | Niaki et al. |

FOREIGN PATENT DOCUMENTS

| | | |
|---|---|---|
| JP | 2016135093 A | 7/2016 |
| JP | 2016177800 A | 10/2016 |

OTHER PUBLICATIONS

Mar. 15, 2022—JP Office Action—JP App. No. 2018-103342.
Dec. 13, 2022—JP Office Action—JP App. No. 2018-103342.

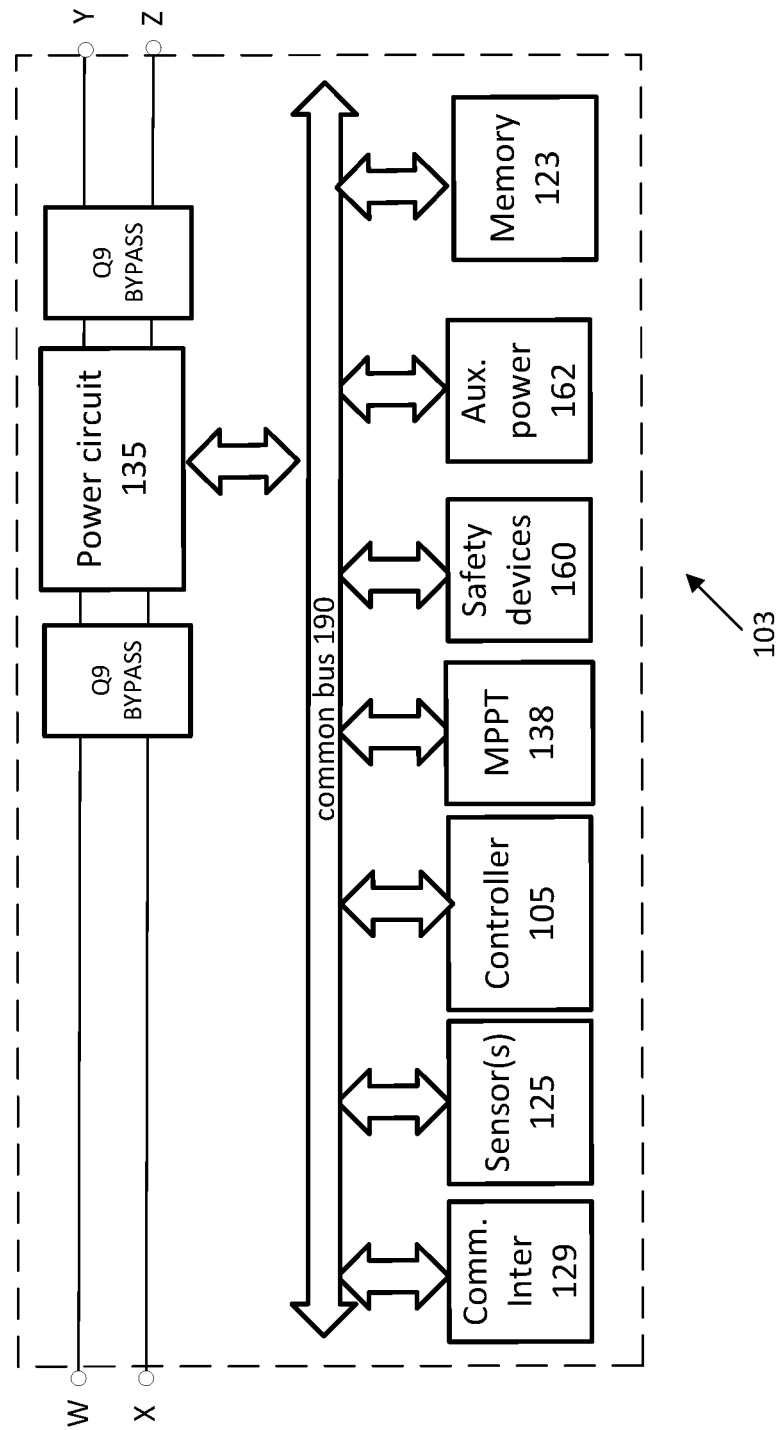

CIRCUIT FOR A POWER DEVICE AND GRAPHICAL USER INTERFACE

RELATED APPLICATIONS

This application is a continuation of U.S. application Ser. No. 15/991,495, filed May 29, 2018, which claims priority to U.S. Provisional Application No. 62/513,054, filed May 31, 2017, entitled "Circuit For A Power Device And Graphical User Interface." The content of the foregoing applications is incorporated by reference in their entireties.

BACKGROUND

Installation and maintenance of power systems often require personnel to understand and apply safety principals when working on a power system. In general, personnel may be required to have a safety awareness which may include the principles of hazardous area classifications, explosion-protection techniques, equipment installation requirements, safe testing procedures, procedures for breakdowns and maintenance, proper and safe isolation and how to perform visual and detailed inspections. Personnel may require specific training in the use of multi-function testing meters, safe isolation procedures and equipment, to properly fill out inspection and testing documentation which may include details of continuity of protective conductors, insulation resistance, protection by safety extra low voltage (SELV), polarity, earth electrode resistance, earth fault loop impedance, residual current device (RCD) testing, earth bonding and prospective fault currents. More specifically, a power system of interconnected photovoltaic panels may present dangers from electrocution and risk to other personnel such as fire fighters, since hazardous voltages may remain even after corrective actions (disconnections, for example) are made.

SUMMARY

The following summary may be a short summary of some of the inventive concepts for illustrative purposes only, and may be not intended to limit or constrain the inventions and examples in the detailed description. One skilled in the art will recognize other novel combinations and features from the detailed description.

Illustrative aspects of the disclosure disclosed herein may be with respect to power sources in a power system and may consider the interconnecting of various groups of power sources. Each group of power sources may contain different types of power derived from both renewable energy sources such as provided from sunlight, wind or wave power and non-renewable energy sources such as fuel used to drive turbines or generators for example. Some illustrative aspects of the disclosure may consider the connecting of DC sources to a load via multiple power devices.

Illustrative aspects of the disclosure disclosed herein may include a power system utilized to supply power to a load and/or a storage device. The power system may include various inter connections of groups of direct currents (DC) or alternating currents (AC) from power sources which also may be connected in various series, parallel, series parallel and parallel series combinations for example.

More specifically, some illustrative aspects of the disclosure may feature a retrofit circuit for a system power device utilized in an interconnected power system. The interconnected power system may include multiple system power devices connected to various inter connections of groups of direct currents (DC) from power sources which also may be connected in various series, parallel, series parallel and parallel series combinations for example. The retrofit circuit may include a processor connected to a memory and a communication interface operatively attached to the processor. The communication interface may be adapted to connect to a mobile computing system of a user in close proximity to the system power devices. A graphical user interface (GUI) of the mobile computing system may provide assistance during various installation, maintenance and monitoring schedules in the interconnected power system to be performed when the user of the GUI is in close proximity to the system power devices. The schedules may help to ensure that an installer or a maintenance person has followed all installation steps, that certified people only are on site, to provide in real time or near real time recording and monitoring of steps being taken (e.g. for quality, regulatory, and failure-analysis purposes). The GUI may enable the activation of bypass units connected to the inputs and outputs of the system power devices. The activation may allow fault finding to occur for example in a series connection of system power device outputs. The activation may help in identifying a faulty system power device and/or faulty power source for example. The activation may therefore eliminate or mitigate the unnecessary removal of housing covers of the housings of the system power devices. Avoiding of the unnecessary removal of housing covers of the housings of the system power devices may avoid the time wasted in removing and reclosing a housing cover, avoid the exposure of open live contacts to people in the vicinity of the system power devices and/or power sources and may also avoid damage to the seals and/or preserve the integrity of seals by unnecessary removing and reclosing of housing covers. The GUI may additionally allow for the recording and uploading of test results made as part of a safety report and/or as part of an electrical inspection and test of a power system for example.

The GUI may enable access to sensors attached to the power sources and/or system power devices to allow monitoring of parameters of in the interconnected power system to be measured and monitored. The parameters may be voltages, currents, power, temperature or the state of charge of a charge storage device attached to the power sources and/or system power devices. The parameters may provide further detail of power supplied to various loads connect to the interconnected power system. The system may further enable the upload of charge profiles for the storage devices or allow a new storage device with a new charge profile to be installed to replace an existing charge storage device for example. Operating parameters of the system power devices may be configured via the GUI as well as how the power from the power sources may be supplied to loads and/or charge storage devices or the criteria for when power from a charge storage device may be supplied to what loads. The system may further enable the upload of load profiles which are responsive to the criteria required for both supplying power to loads and/or charge storage devices and supplying power from the charge storage devices to the loads. The criteria may include a load demand history based on the time of day, month and/or year for example.

As noted above, this Summary may be merely a summary of some of the features described herein. It may be not exhaustive, and it may be not to be a limitation on the claims.

BRIEF DESCRIPTION OF THE DRAWINGS

FIG. 1C illustrates circuitry which may be found in a power device such as a power device, according to illustrative aspects of the disclosure.

Figure 1A:
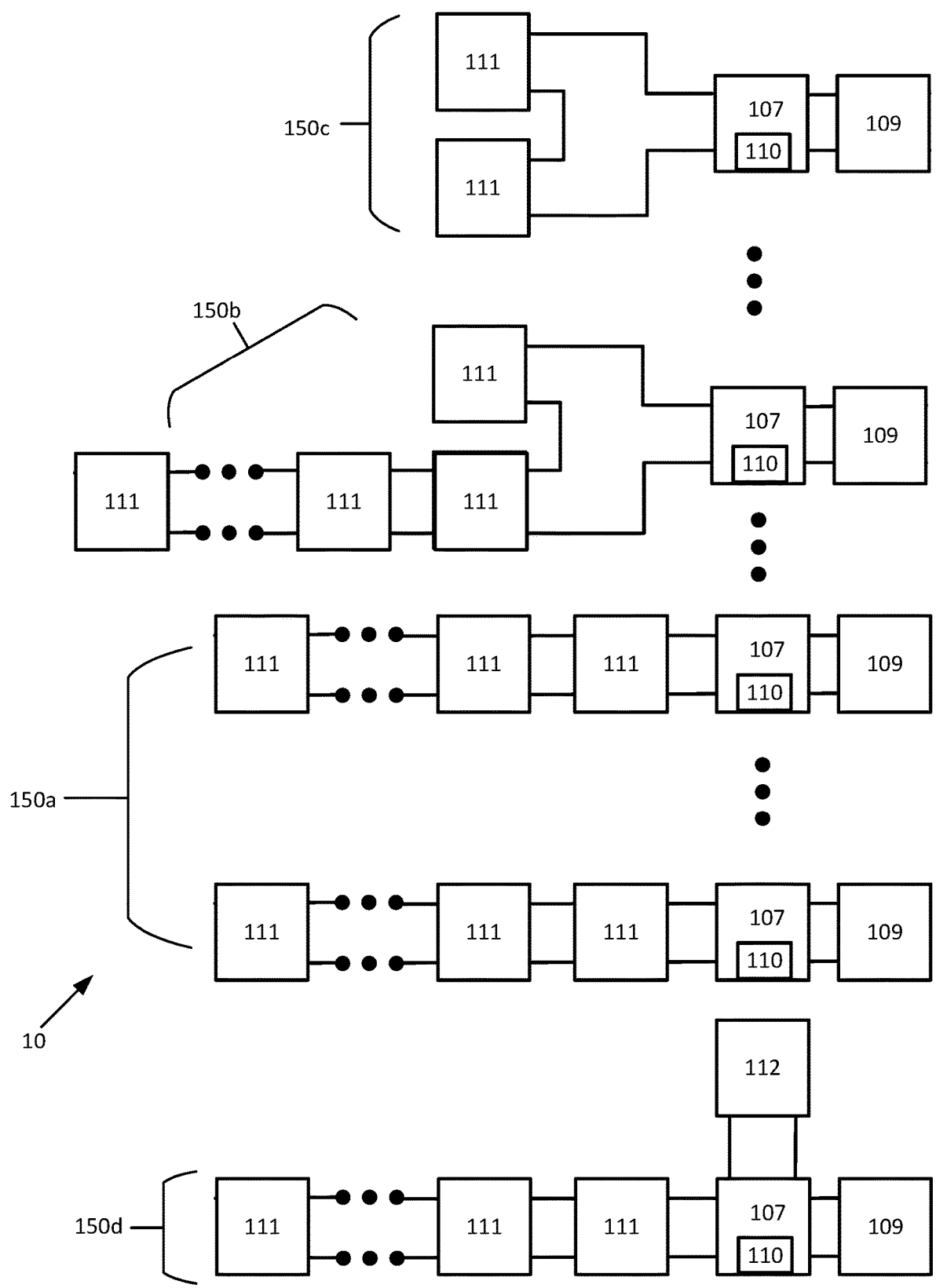
FIG. 1A shows a block diagram of a power system, according to illustrative aspects of the disclosure.

These and other features, aspects, and advantages of the present disclosure will become better understood with regard to the following description, claims, and drawings. The present disclosure may be illustrated by way of example, and not limited by, the accompanying figures.

DETAILED DESCRIPTION

In the following description of various illustrative aspects of the disclosure, reference may be made to the accompanying drawings, which form a part hereof, and in which may be shown, by way of illustration, various embodiments in which aspects of the disclosure may be practiced. It may be to be understood that other embodiments may be utilized and structural and functional modifications may be made, without departing from the scope of the present disclosure.

By way of introduction, features of illustrative aspects of the disclosure may be directed to retrofit circuits to various components of a power system or to circuits already included in the various components of the power system. The retrofit circuits and circuits may provide access to a server via a connection between a mobile computing system and a network. The connection may allow for example the update of firmware of the various components of a power system when a user is in proximity to the various components of the power system. The update of firmware of the various components of a power system may be provided from a storage of the mobile computing system when connection to the server and/or network is not available. The connection may additionally provide for example, the upload of data measured and monitored by the user of operating parameters of the power system during installation and/or maintenance of the power system. The connection may additionally provide for example, allowance for storage of data monitored and measured in the mobile computing system when a connection to a server and/or network is not available. The stored data may then be subsequently uploaded to a server and/or network when a connection to the server and/or network is next available. In a similar way, the latest firmware update of the various components of the power system may be made when a connection to the server and/or network is available.

For example, a photovoltaic inverter might not support an internet connection or may be installed in a location (e.g., a basement) where an internet connection is not available. An installer may connect to a server and/or network and download a firmware update to a mobile computing system prior to going onsite and/or servicing the inverter. The installer may go onsite, communicatively connect the mobile computing system to the inverter (e.g. using a local wired or wireless connection), transfer the firmware update to the inverter, receive data from the inverter, and once leaving the site—reconnect to the server and/or network and transmit the data received from the inverter for further data storage and/or analysis.

The term "multiple" as used here in the detailed description indicates the property of having or involving several parts, elements, or members. The claim term "a plurality of" as used herein in the claims section finds support in the description with use of the term "multiple" and/or other plural forms. Other plural forms may include for example regular nouns that form their plurals by adding either the letter 's' or 'es' so that the plural of converter is converters or the plural of switch is switches for example.

Reference is made to FIG. 1A which shows a power system 10, according to illustrative aspects of the disclosure. Power system 10 includes multiple wiring configurations 111. Wiring configurations 111 are shown in various multiple parallel connections 150a/150d of wiring configurations 111 to each other, a parallel series connections 150b of wiring configurations 111 and a series connection 150c of wiring configurations 111. Various other inter connections of wiring configurations 111 may be formed such as a series parallel connecting of wiring configurations 111 and/or various interconnections between connections 150a, 150b, 150c and 150d for example. Each wiring configuration 111 may further include various interconnections of power sources and/or power devices (not shown in FIG. 1A) which are described in further detail in descriptions which follow. The outputs of each respective connections 150a, 150b, 150c and 150d may connect to the input of a system power device 107. The output of each system power device 107 may connect to a load 109. System power device 107 may be a direct current (DC) to alternating current (AC) inverter, a DC to DC converter or an AC to DC converter for example. Load 109 may be a DC load such as a battery, a utility grid which may be AC or DC, or an electrical motor and/or generator for example. Loads 109 may be separate and/or common to each other (multiple loads 109 indicated in FIG. 1A may represent a single utility grid).

In connection 150d a storage device 112 (e.g. a battery, a supercapacitor, a flywheel, etc.) connects to system power device 107. As such, storage device 112 may be utilized to store charge from power produced by wiring configurations 111 via system power device 107 and/or power from load 109 if load 109 is another source of power from other connections 150a, 150b, and 150c and/or another source of power such as an AC or DC utility grid for example. Storage device 112 may be utilized to supply power to load 109 when power from connections 150a, 150b, 150c and 150d is not available and/or is at level which may not be sufficient to supply load 109. Power not being available from connections 150a, 150b, 105c and 150d may be as a result of wiring configurations 111 including photovoltaic panels which may be shaded or not producing power at night time. Alternatively, configurations 111 may include wind turbines which may cause lower power produced from connections 150a, 150b, 105c and 150d if there is no wind. Further, configurations 111 may include fuel driven generators, where an absence of fuel causes minimized power produced from connections 150a, 150b, 105c and 150d. As such, with the above considerations a feature of system power device 107 connected to storage device 112 may be to convert power from a grid (when load 109 is a utility grid) to charge storage device 112 and/or convert power from storage device 112 in order to supply power to load 109. It should be understood that even though the storage device 112 is connected to the parallel connection 150d, the storage device 112 may be connected to any of other connections 150a, 150b, or 150c.

System power device 107 and/or storage devices 112 may include an integrated local communication device 110 or may be retrofitted with local communication device 110. Local communication device 110 may also be realized by a power line communication (PLC) device which may be magnetically coupled to power lines, and the magnetic coupling might not require direct electrical connection to the power lines which inter-connect wiring configurations 111 to system power devices 107 and loads 109. The PLC devices may connect to the power cables via clamping mechanism and may enable communications between various parts of power system 10 in order to provide monitoring and control of the various devices within power system 10. Further details of local communication device 110 are shown in the descriptions below with regards to FIGS. 1E, 2 and 3.

Figure 1B:
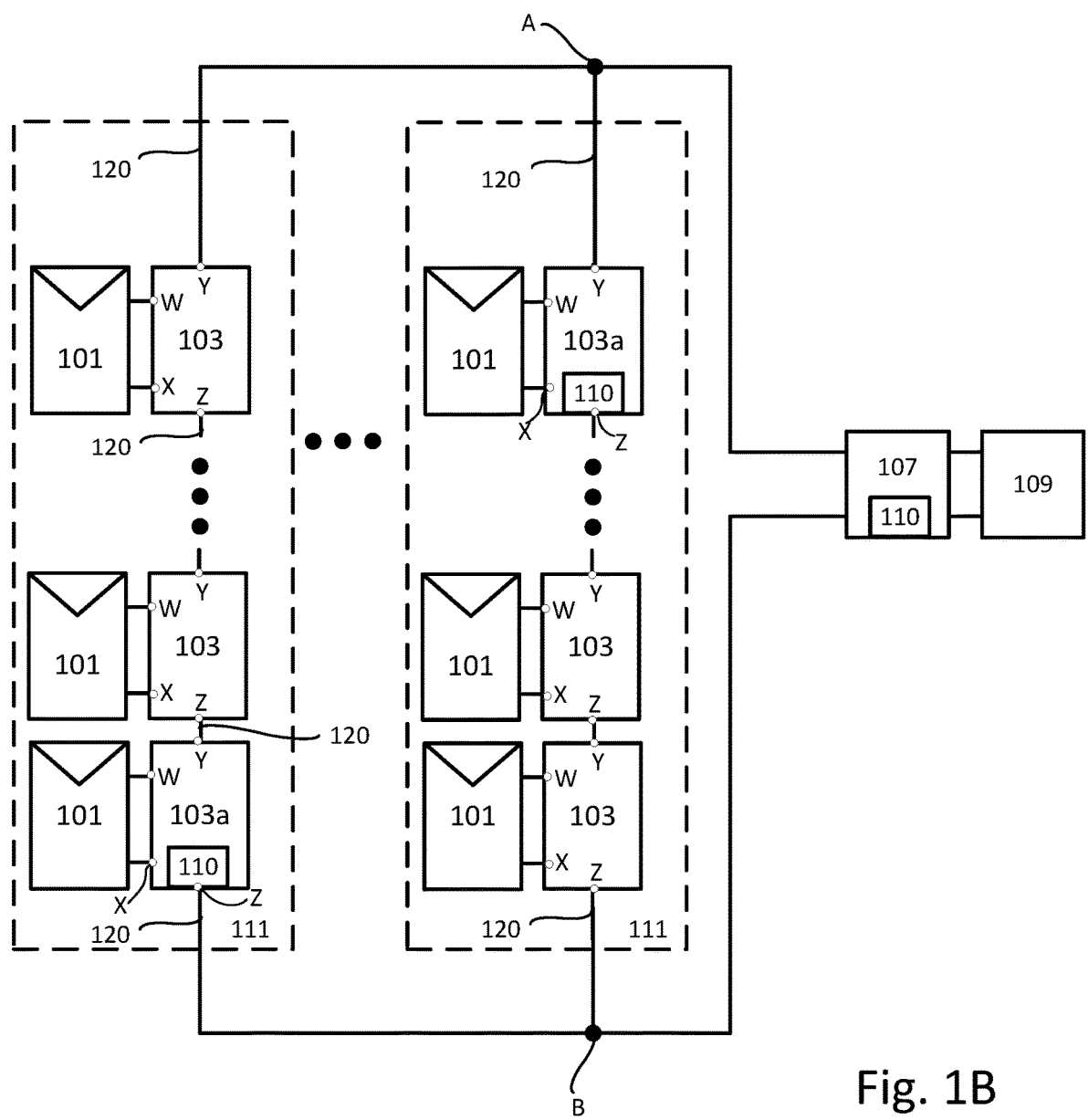
FIG. 1B illustrates further details of wiring configurations and their connections to system power devices, according to illustrative aspects of the disclosure.

Reference is now made to FIG. 1B, which illustrates further details of wiring configurations 111 and their connections to system power device 107, according to illustrative aspects of the disclosure. Multiple wiring configurations 111 are shown connected in parallel at terminals A and B which connect to the input of system power device 107. The output of system power device 107 may connect to load 109. Each wiring configuration 111 may include one or more power sources 101 which may be connected to a respective power device 103 and/or power device 103a at terminals W, X. The outputs of power devices 103/103a at terminals Y, Z may be connected together to form a serial string which connects between terminals A and B. Local communication devices 110 are shown connected to system power device 107 and may also be connected to power device 103a. Local communication device 110 may be an integrated part of system power devices 107/power devices 103 and/or retrofitted to system power devices 107/power devices 103. Features of local communication device 110 are described in greater detail below in the descriptions which follow.

In some embodiments, one or more wiring configurations 111 might not include power devices 103a or 103. For example, a wiring configuration 111 may include multiple power sources 101 directly connected in series or in parallel. For example, a wiring configuration 111 may have ten, twenty or thirty serially-connected photovoltaic panels. In some embodiments, a wiring configuration 111 may include a first group of one or more directly connected power sources 101, with a second group of one or more power sources 101 connected via power devices 103a or 103 connected to the first group. This arrangement may be useful in power installations where some power sources 101 may be susceptible to factors which reduce power generation (e.g. PV generators which are occasionally shaded, wind turbines which occasionally suffer from a reduction in wind), with other power sources 101 less susceptible to power-reducing factors.

Reference is now made to FIG. 1C, which illustrates circuitry which may be found in a power device such as power device 103/103a, according to illustrative aspects of the disclosure. Power device 103/103a may be similar to or the same as power device 103/103a shown in FIG. 1A which may provide respective input and output terminals W, X and Y, W. Input and output terminals W, X and Y, W may provide connection to power lines 120 (not shown). In some embodiments, power device 103/103a may include power circuit 135. Power circuit 135 may include a direct current-direct current (DC/DC) converter such as a Buck, Boost, Buck/Boost, Buck+Boost, Cuk, Flyback and/or forward converter, or a charge pump. In some embodiments, power circuit 135 may include a direct current-alternating current (DC/AC) converter (also known as an inverter), such as a micro-inverter. Power circuit 135 may have two input terminals and two output terminals, which may be the same as the input terminals and output terminals of power device 103/103a. In some embodiments, Power device 103/103a may include Maximum Power Point Tracking (MPPT) circuit 138, configured to extract increased power from a power source.

In some embodiments, power circuit 135 may include MPPT functionality. In some embodiments, MPPT circuit 138 may implement impedance matching algorithms to extract increased power from a power source the power device may be connected to power device 103/103a may further include controller 105 such as a microprocessor, Digital Signal Processor (DSP), Application-Specific Integrated Circuit (ASIC) and/or a Field Programmable Gate Array (FPGA).

Still referring to FIG. 1C, controller 105 may control and/or communicate with other elements of power device 103/103a over common bus 190. In some embodiments, power device 103/103a may include circuitry and/or sensors/sensor interfaces 125 configured to measure parameters directly or receive measured parameters from connected sensors and/or sensor interfaces 125 configured to measure parameters on or near the power source, such as the voltage and/or current output by the power source and/or the power output by the power source. In some embodiments, the power source may be a photovoltaic (PV) generator comprising PV cells, and a sensor or sensor interface may directly measure or receive measurements of the irradiance received by the PV cells, and/or the temperature on or near the PV generator.

Still referring to FIG. 1C, in some embodiments, power device 103/103a may include communication interface 129, configured to transmit and/or receive data and/or commands from other devices. Communication interface 129 may communicate using Power Line Communication (PLC) technology, acoustic communications technology, or additional technologies such as ZIGBEE™, Wi-Fi, BLUETOOTH™, cellular communication or other wireless methods. Power Line Communication (PLC) may be performed over power lines 120 between power devices 103/103a and system power device (e.g. inverter) 107 which may include as similar communication interface as communication interface 129.

In some embodiments, power device 103/103a may include memory 123, for logging measurements taken by sensor(s)/sensor interfaces 125 to store code, operational protocols or other operating information. Memory 123 may be flash, Electrically Erasable Programmable Read-Only Memory (EEPROM), Random Access Memory (RAM), Solid State Devices (SSD) or other types of appropriate memory devices.

Still referring to FIG. 1C, in some embodiments, power device 103/103a may include safety devices 160 (e.g. fuses, circuit breakers and Residual Current Detectors). Safety devices 160 may be passive or active. For example, safety devices 160 may include one or more passive fuses disposed within power device 103/103a where the element of the fuse may be designed to melt and disintegrate when excess current above the rating of the fuse flows through it, to thereby disconnect part of power device 103/103a so as to avoid damage. In some embodiments, safety devices 160 may include active disconnect switches, configured to receive commands from a controller (e.g. controller 105, or an external controller) to short-circuit and/or disconnect portions of power device 103/103a, or configured to short-circuit and/or disconnect portions of power device 103/103a in response to a measurement measured by a sensor (e.g. a measurement measured or obtained by sensors/sensor interfaces 125). In some embodiments, power device 103/103a may include auxiliary power circuit 162, configured to receive power from a power source connected to power device 103/103a, and output power suitable for operating other circuitry components (e.g. controller 105, communication interface 129, etc.). Communication, electrical connecting and/or data-sharing between the various components of power device 103/103a may be carried out over common bus 190. In some embodiments, auxiliary power circuit 162 may be connected to an output of a power device 103/103a and designed to receive power from power sources connected to other power devices.

Power device 103/103a may include or be operatively attached to a maximum power point tracking (MPPT) circuit. The MPPT circuit may also be operatively connected to controller 105 or another controller 105 included in power device 103/103a which may be designated as a primary controller. A primary controller in power device 103/103a may communicatively control one or more other power devices 103/103a which may include controllers known as secondary controllers. Once a primary/secondary relationship may be established, a direction of control may be from the primary controller to the secondary controllers. The MPPT circuit under control of a primary and/or central controller 105 may be utilized to increase power extraction from power sources 101 and/or to control voltage and/or current supplied to system power device (e.g. an inverter or a load) 107.

Referring still to FIG. 1C, in some embodiments, power device 103/103a may include bypass unit Q9 coupled between the inputs of power circuit 135 and/or between the outputs of power circuit 135. Bypass unit Q9 and/or power circuit 135 may be a junction box to terminate power lines 120 or to provide a safety feature such as fuses or residual current devices. Bypass unit Q9 may also be an isolation switch for example. Bypass unit Q9 may be a passive device, for example, a diode. Bypass units Q9 may be controlled by controller 105. If an unsafe condition is detected, controller 105 may set bypass unit Q9 to ON, short-circuiting the input and/or output of power circuit 135. In a case in which the pair of power sources 101 are photovoltaic (PV) generators, each PV generator provides an open-circuit voltage at its output terminals. When bypass unit Q9 is ON, a PV generators may be short-circuited, to provide a voltage of about zero to power circuit 135. In both scenarios, a safe voltage may be maintained, and the two scenarios may be staggered to alternate between open-circuiting and short-circuiting PV generators. This mode of operation may allow continuous power supply to system control devices, as well as provide backup mechanisms for maintaining a safe voltage (i.e., operation of bypass unit Q9 may allow continued safe operating conditions).

In some embodiments, a power device 103/103a may comprise a partial group of the elements illustrated in FIG. 1C. For example, a power device 103/103a might not include power circuit 135 (i.e. power circuit 135 may be replaced by a short circuit, and a single bypass unit Q9 may be featured. In a scenario where power circuit 135 is not present, power device 103/103a may be still used to provide safety, monitoring and/or bypass features.

Figure 1D:
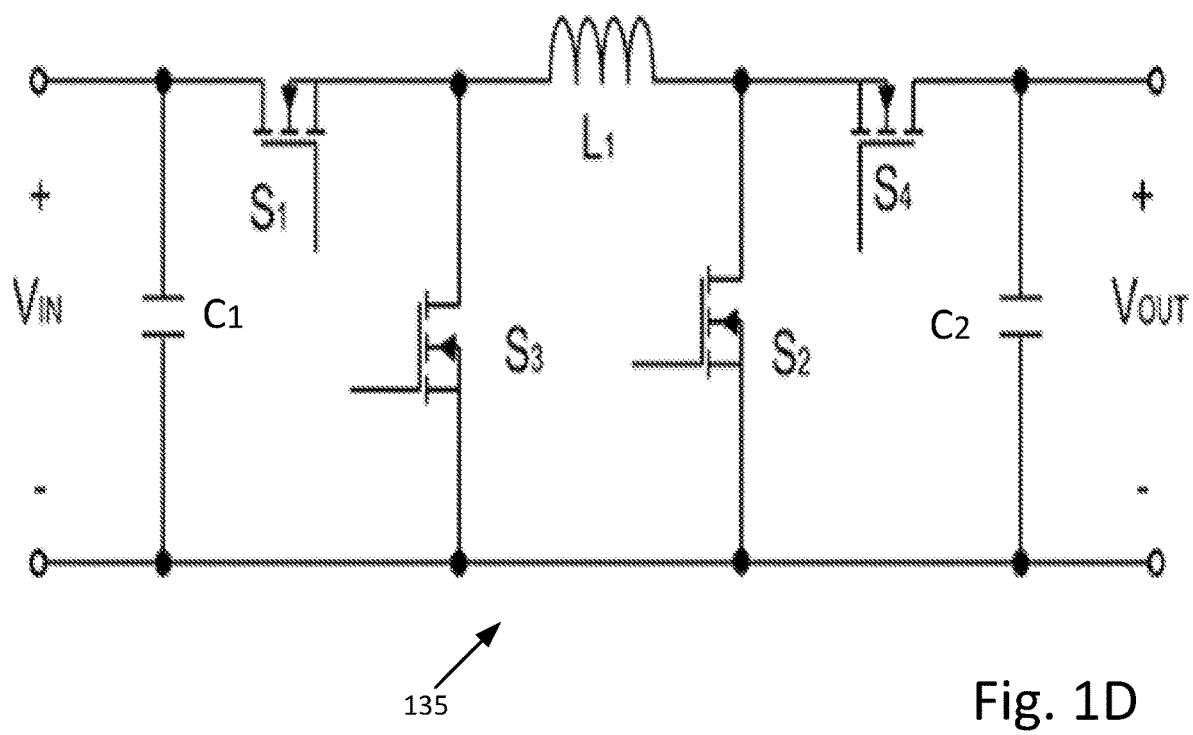
FIG. 1D shows a buck+boost circuit implementation for a power circuit, according to one or more illustrative aspects of the disclosure.

Reference is now made to FIG. 1D, which shows a buck+boost circuit implementation for power circuit 135, according to one or more illustrative aspects of the disclosure. The buck+boost circuit implementation for power circuit 135 utilizes metal oxide semi-conductor field effect transistors (MOSFETs) for switches S1, S2, S3 and S4. The sources of switches S1, S2, S3 and S4 are referred to as first terminals, the drains of S1, S2, S3 and S4 are referred to second terminals and the gates of S1, S2, S3 and S4 are referred to as third terminals. Capacitor C1 may be connected in parallel across the respective positive (+) and negative (−) input terminals C and D of the buck+boost circuit where the voltage may be indicated as VIN. Capacitor C2 may be connected in parallel across the respective positive (+) and negative (−) output terminals A and B of the buck+boost circuit where the voltage may be indicated as VOUT. First terminals of witches S3 and S2 may connect to the common negative (−) output and input terminals of the buck+boost circuit. A second terminal of switch S1 may connect to the positive (+) input terminal and a first terminal of switch S1 may connect to a second terminal of switch S3. A second terminal of switch S4 may connect to the positive (+) output terminal and a first terminal of switch S4 may connect to the second terminals of switch S2. Inductor L1 may connect respectively between the second terminals of switches S3 and S4. Third terminals of switches S1, S2, S3 and S4 may be operatively connected to controller 105.

Switches S1, S2, S3 and S4 may be implemented using semi-conductor devices, for example, metal oxide semiconductor field effect transistors (MOSFETs), insulated gate bipolar transistors (IGBTs), bipolar junction transistors (BJTs), Darlington transistor, diode, silicon controlled rectifier (SCR), Diac, Triac or other semi-conductor switches known in the art. Using by way of example, switches S1, S2, S3 and S4 may be implemented by use of bipolar junction transistors where the collectors, emitters and bases may refer to first terminals, second terminals and third terminals described and defined above. Switches S1, S2, S3 and S4 may be implemented using mechanical switch contacts such as hand operated switches or electro-mechanically operated switches such as relays for example. Similarly, implementation for power device 103/103a may include, for example, a buck circuit, a boost circuit, a buck/boost circuit, a Flyback circuit, a Forward circuit, a charge pump, a Cuk converter or any other circuit which may be utilized to convert power on the input of power device 103/103a to the output of power device 103/103a.

Figure 1E:
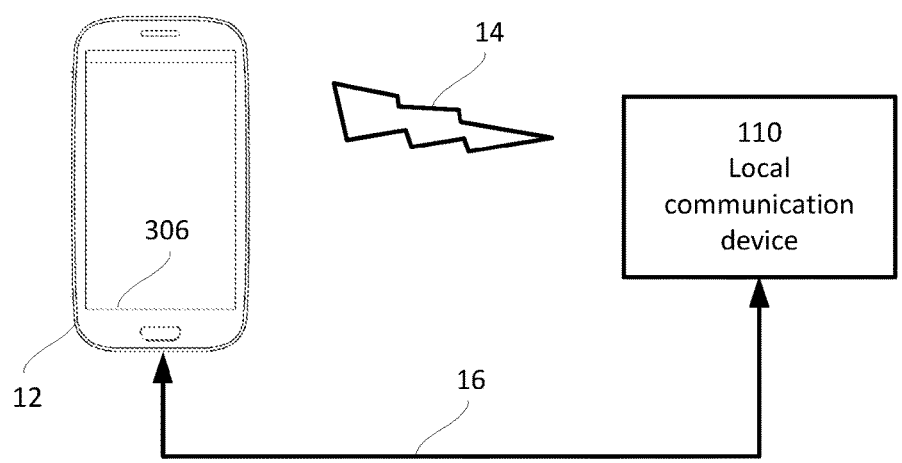
FIG. 1E shows a connecting between a mobile computer system and local communication device, according to illustrative aspects of the disclosure.

Reference is made to FIG. 1E which shows a connecting between mobile computer system 12 and local communication device 110, according to illustrative aspects of the disclosure. Mobile computing system 12 is shown as a smart phone but may also be a different device, for example, a laptop computer or tablet device. The connecting between mobile computing system 12 and local communication device 110 may be by use of a cable 16 and/or wireless connection 14. Cable 16 may be a Universal Serial Bus (USB™) cable or any other data cable such as an optical fiber cable, coaxial cable or Ethernet cables such as Cat5 or Cat5e for example. Wireless connection 14 may be via wireless technologies such as Near-field communication (NFC), ZIGBEE™, Wi-Fi, Wireless USB™ and BLUETOOTH™ for example. Mobile computing system 12 is shown with a display 306 which may provide a graphical user interface (GUI) to a user.

Figure 2:
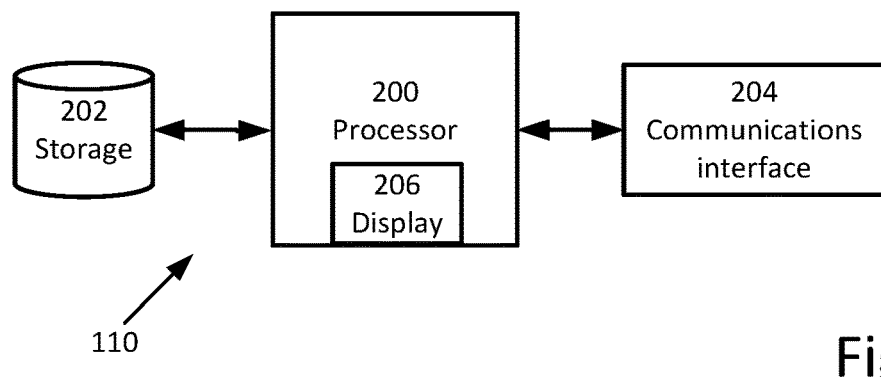
FIG. 2 illustrates a simplified block diagram of local communication device, according to one or more illustrative aspects of the disclosure.

Reference is now made to FIG. 2 which illustrates a simplified block diagram of local communication device 110, according to one or more illustrative aspects of the disclosure. Processor 200 may connect bidirectionally to a memory storage 202 in order allow reading and writing of data to and from memory storage 202. Local communication device 110 may also include a display 206 operatively attached to processor 200. Communication interface 204 may connect bidirectionally to processor 200 to allow a connection between a mobile computer system 12 and a local communication device 110. The connection may allow local communication device 110 to be connected to a server and a cellular network via mobile computer system 12. The connection may typically allow a user to run an application on mobile computing system 12 which allows the user and/or a remote user to communicate, control and configure system power devices 107, power devices 103/103*a* and/or storage device(s) 112 (which include a local communication device 110) when the user is in the near vicinity of a local communication device 110 using cable 16 and/or wireless connection 14 described above. Local communication device 110 may also provide in system power devices 107 and/or power devices 130/103*a* to include extra sensors, MPPT circuits, an additional control function, safety devices and aux power in system power devices 107 and/or power devices 130/103*a* which do not have these extra features as a part of a retrofit of power system 10 for example.

Figure 3:
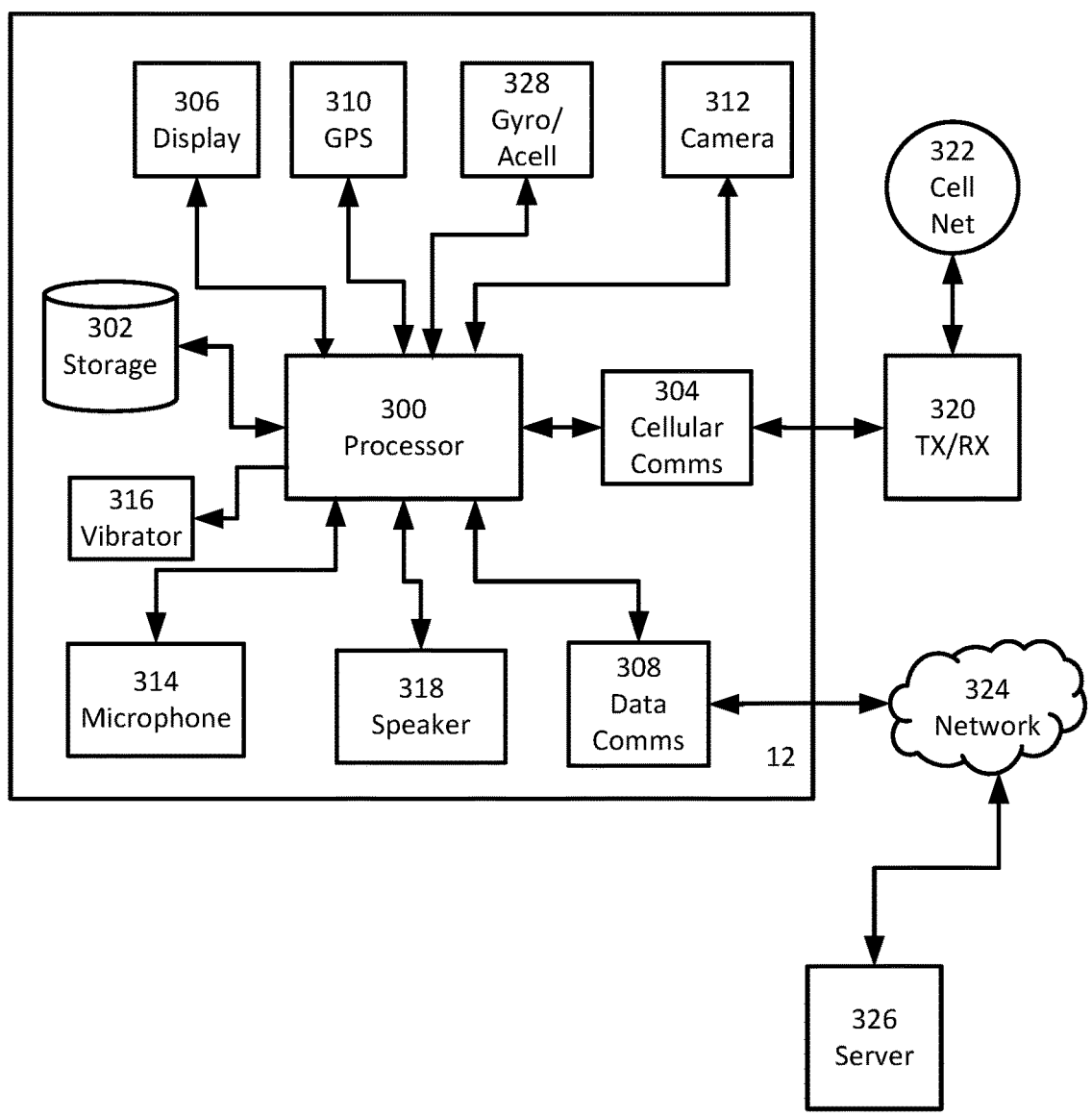
FIG. 3 illustrates a simplified block diagram of mobile computer system, according to one or more illustrative aspects of the disclosure.

Reference is now made to FIG. 3 which illustrates a simplified block diagram of mobile computer system 12 according to one or more illustrative aspects of the disclosure. Mobile computer system 12 may be for example an iPhone™ of Apple Inc., a laptop computer or a smart-phone configured to run an Android™ open operating system. Mobile computer system 12 may be connectible over a network 324 to a server 326. Mobile computer system 12 may be also connectible through a cellular base station transceiver 320 to the remainder of cellular network 322. Mobile computer system 12 may include a processor 300 connected to local data storage 302. A data communications module 308 may connect processor 300 to network 324. A cellular communications module 304 may connect processor 300 to cellular network 322, and cellular network 322 may be further connected to the internet. Mobile computer system 12 may include connected to processor 300, peripheral accessory devices such as a display 306, global positioning system (GPS) 310, camera 312, a microphone 314, a speaker 318, a vibrator 316, accelerometer/gravity sensor/gyroscopic sensor unit 328, Blue-Tooth™, infra-red sensor (not shown). Display 306 may provide a graphical user interface (discussed later) to a user for an application, which runs on mobile computing system 12. A user of mobile computer system 12 may be an installer of power systems such as power system 10 for example. The user may be a maintenance engineer, manager or person responsible for the upkeep of a power system such as power system 10. The application allows the user via a local communication device (e.g. local communication device 110) to communicate, control and configure system power devices 107, power devices 103/103*a* and/or storage device(s) 112.

Figure 4:
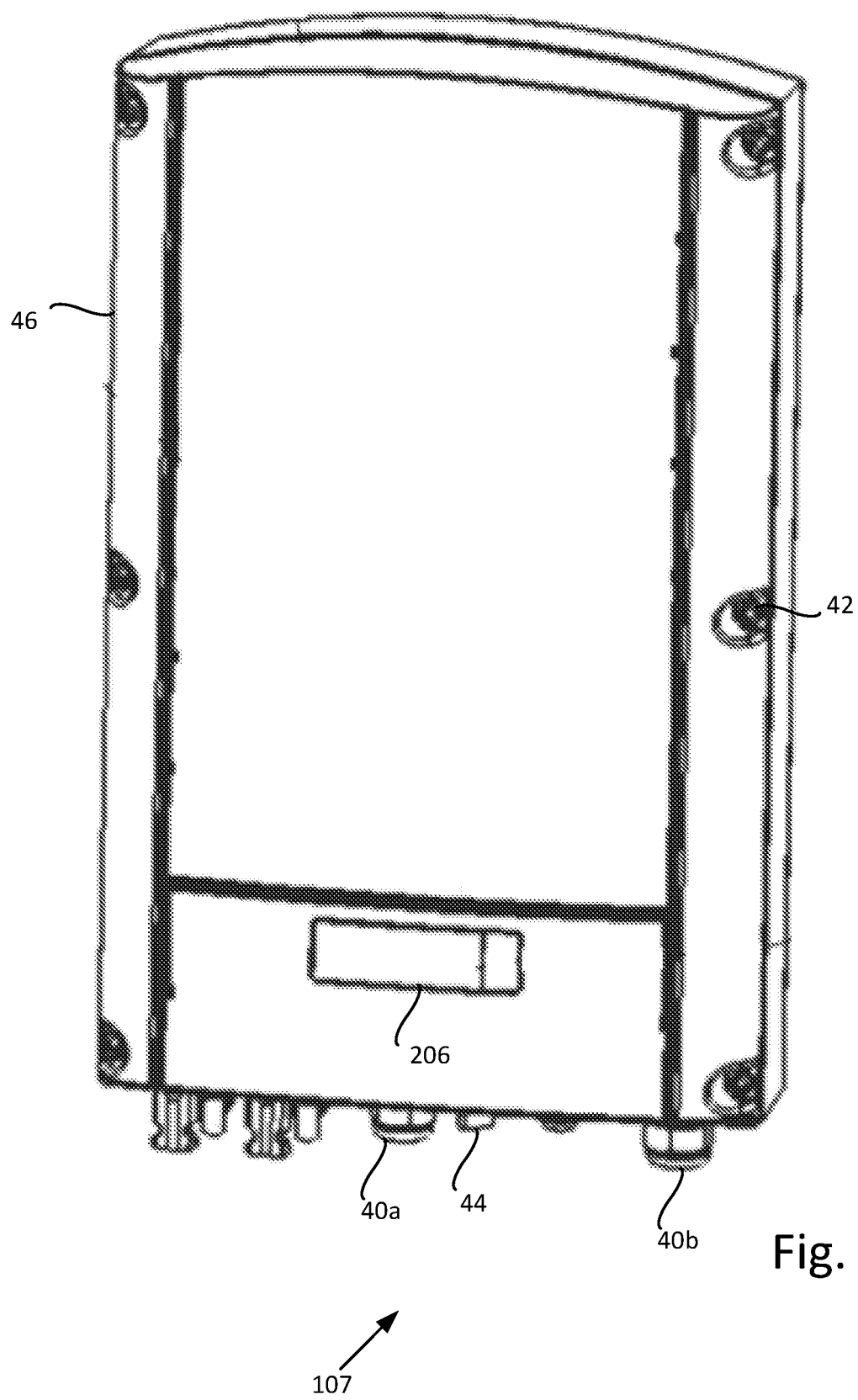
FIG. 4 shows an isometric drawing of a housing which houses a system power device, according to one or more illustrative aspects of the disclosure.

Reference is now made to FIG. 4 which shows an isometric drawing of a housing 46 which houses system power device 107, according to one or more illustrative aspects of the disclosure. Housing 46 may include data connector 44 which may allow the connection of cable 16 between local communication device 110 and mobile computing system 12. Cable glands 40*a* and 40*b* may be used for the insertion and securing of power lines 120 of FIG. 1B (not shown in FIG. 4) for which the conductors of power lines 120 may then be terminated inside housing 46. System power device 107 is shown as a system power device designed for receiving a retrofit communication system. The retrofitting may include the attachment and location of local communication device 110 (not shown in FIG. 4) inside housing 46 and housing 46 modified to allow display 206 to be mounted on the front panel of housing 46. According to some illustrative aspects, display 206 may extend across a substantial portion of housing 46 (e.g., display 206 may extend across the entire front panel or most of the front panel of housing 46) The front panel is shown attached to the rear portion of housing 46 with fasteners 42. The retrofitting may further include the attachment of a data connector 44 which connects to local communication device 110. Alternatively, local communication device 110 may be attached in close proximity or vicinity to system power device 107 or power device 103.

Retrofitting system power device 107 and/or power device 103*a* with a local communication device 110 may be due to system power device 107 or power device 103/103*a* not presently providing to a user a certain mechanisms of communication. The retrofitting may be temporary or permanent. For example, in some embodiments, a mobile phone may serve as local communication device, and may be communicatively paired to a system power device 107 or a power device 103/103*a* via, for example, a local wireless protocol (e.g. Near Field Communication (NFC), BLUETOOTH™, ZIGBEE™ or WiFi) or by connecting the mobile phone to a communication port mounted on the system power device or power device. The communication pairing may be used to provide an attached power device with certain services for a period of time, and after the services are provided the communication pairing may be severed by removing the mobile phone.

The communication pairing may be utilized to provide, for example, the feature of a firmware update or software update to system power device 107 or power device 103/103*a*. The firmware update or software update may be provided from a server (e.g. server 326 of FIG. 3) through a mobile computing system (e.g. mobile computing system 12 of FIG. 3) for example. The firmware update or software update may be provided from storage 302 of mobile computing system 12 to local communication device 110 in situations where a connection between server 326 and local communication device 110 is unavailable.

The mechanisms of communication may provide a feature via mobile computing system 12, to assign a GPS coordinate to system power device 107 from GPS 310 and/or a unique identification (ID) number to system power devices 107 and/or power devices 103/103*a*. The GPS co-ordinate and/or ID number may then be utilized to provide a record of the pairing between system power devices 107, between system power device 107 and power devices 103/103*a* and/or between power devices 103/103*a* connected in serial string of power device outputs for example. The record may then be stored in memory storage 202 of FIG. 1C and/or memory storage in data network 324/server 326 of FIG. 3. The record up-loadable and downloadable to server 326 and storable in storages 202/302 may also include information such as the user name of an operative, time and date when activated by the operative, verification of user name and password of the operative, the updated firmware version and previous firmware versions and a log of any errors with system power devices 107 or power devices 103/103a. The record as such may also provide a topographical layout of power system 10 and also provide an updateable feature of the topographical layout as a result of a maintenance or installation procedure performed by the operative on power system 10.

The updateable feature may include for example, an addition to, subtraction of, repair of, or re-positioning of wiring configurations 111, system power devices 107, power devices 103/103a, storage device 112 and loads 109. The updateable record as such may be utilized to track the actions of the operative when the operative is meant to be performing their function at various times and/or locations of power system 10. The actions of the operative may be tracked and monitored by virtue of the operative and/or mobile computing system 12 being in the vicinity of local communication device 110. Mobile computing system 12 being in the vicinity of local communication device 110 may activate a connection to server 326 such that movements and/or actions of the operative may be monitored and conveyed to another party over the internet for example.

Mobile computing system 12 being in the vicinity of local communication device 110 may also be used to warn/inform by a Short Message Service (SMS) from cellular network 322 to other personnel associated with power system 10 that the operative is performing installation and/or maintenance presently on a particular system power device 107 and/or power device 103/103a. The SMS may therefore also include the location of the operative and the amount of time the operative has spent in a particular location of power system 10 for example. The mechanisms of communication provided to a retrofit of system power device 107 and/or power device 103/103a with a local communication device 110 may also allow an alternative or additional control function to system power device 107 and/or power device 103a by use of processor 200 for example instead of or in addition to an existing processor of system power device 107 and/or power device 103/103a.

The mechanisms of communication provided to a retrofit of system power devices 107 and/or power devices 103/103a with a local communication device 110 may also allow an alternative or additional control function to system power device 107 and/or power device 103a. The alternative or additional control function by use of processor 300 of mobile computing system 12 instead of processor 200 may be applied to other system power devices 107 and/or power devices 103/103a via power line communications for example. The alternative or additional control function by use of processor 300 of mobile computing system 12 instead of processor 200 may be for a temporary purpose. The temporary purpose may allow for a reconfiguration of other system power devices 107 and/or power devices 103/103a for a temporary appraisal and/or reporting of the effectiveness of the reconfiguration. Once the temporary appraisal and/or reporting of the effectiveness of the reconfiguration is finished, normal use of processor 200 or an existing processor of system power devices 107 and/or power devices 103/103a may continue.

Figure 5:
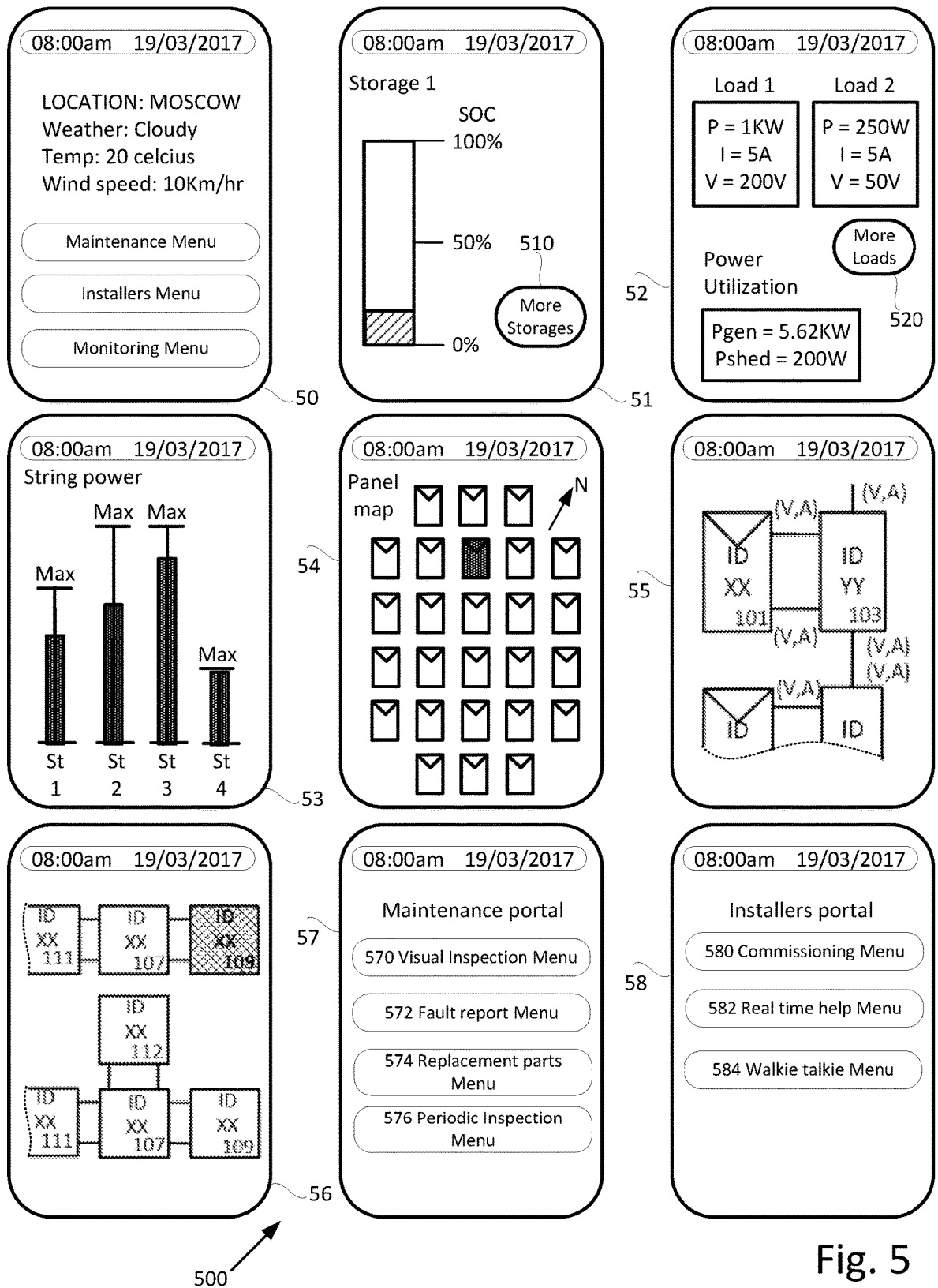
FIG. 5 shows various screen portions of graphical user interfaces (GUIs) provided on a display of a mobile computing system, according to one or more illustrative aspects of the disclosure.

Reference is now made again to FIGS. 1A, 1B by way of example and to FIG. 5 which shows various screen portions of graphical user interfaces (GUIs) 500 provided on display 306 of mobile computing system 12, according to one or more illustrative aspects of the disclosure. With reference to FIG. 1A, wiring configurations 111 may further include power sources 101 which may be DC derived from wind turbines, battery banks, or petrol generators for example. By way of non-limiting example, reference is made to power sources 101 of FIG. 1A and FIG. 1B which are solar panels connected to the inputs of power devices 103/103a for ease of discussion which follows. Power devices 103 may already include features which allow communication between power device 103 and mobile computing system 12. Power devices 103a may be power devices similar to power devices 103 but have been retrofitted with local communication device 110 to allow communication between power device 103a and mobile computing system 12. The outputs of power devices 103/103a are wired in series to form a series string which may be connected across the input of system power device 107 at terminals A and B.

Screen areas 50, 51, 52, 53, 54, 55, 56, 57, and 58 of GUIs 500 may be included on one graphical screen or be displayed on different graphical screens (e.g. depending on the screen size available). In the description that follows, a touch screen is referenced by way of example but other screen such as computer monitors may be used where items may be selected for example by mouse and pointer.

Descriptions which follow may assume the physical presence of a user and mobile computing system 12 in proximity to wiring configurations 111, system power devices 107, power devices 103/103a, storage device 112 and loads 109 of power system 10 retrofitted with local communication device 110 or which already include features of local communication device 110. Physical presence of a user and mobile computing system 12 in proximity to wiring configurations 111 may enable a communication between mobile computing system 112 and power devices 107. The communication may be via use of a cable 16 and/or wireless connection 14 as shown in FIG. 1E. Cable 16 may be a Universal Serial Bus (USB™) cable or any other data cable such as an optical fiber cable, coaxial cable or Ethernet cables such as Cat5 or Cat5e for example. Wireless connection 14 may be via wireless technologies such as Near-field communication (NFC), ZIGBEE™, Wi-Fi, Wireless USB™ and BLUETOOTH™. Physical presence of the user and mobile computing system 12 may be further established and verified in that the communication may include a further feature of authentication/encryption, key management, trusted authority or handshaking that goes on through local communication device 110. The further feature may therefore be a way of detecting the physical presence of the user and mobile computing system 12 in the vicinity of wiring configurations 111 and/or power devices 107. The further addition may for example avoid an update to power system 10 using malicious code or an attempt to update powers system 10 when a user or a malicious user is not in physical proximity to wiring configurations 111.

In general, an application running on mobile computing system 12 allows a user (e.g. via local communication device 110) to communicate, control, monitor and configure system power devices 107, power devices 103/103a and/or storage device(s) 112. In general in the descriptions which follow screen areas 50, 51, 52, 53, 54, 55, 56, 57, and 58 of GUIs 500 may provide upload and download of data from server 326/network 324 as well as data from one mobile computing system 12 to another mobile computing system 12 directly, via retrofit communication circuits such as local communication device 110, existing communication circuits and/or a combination of retrofit communication circuits, existing communication circuits and power line communications. Power line communications may be performed over power lines 120 between power devices 103/103a and system power device (e.g. inverter) 107 which may include as similar communication interface as communication interface 129 for example.

In general, screen areas each may serve overall as an icon which when touched or swiped by the user using a touch screen device such as a smart phone as shown in FIG. 1E, allows a number of sub menu options to appear. The sub menu may for example allow the user to view another power system or distinct separate portions of power system 10 as shown by connections 150a, 150b, 150c and 150d in FIG. 1A for example.

GUIs 500 may include for example, a master screen area 50 which may give a user information as to the location of power system 10 for example, the local time and date, an indication as to the weather conditions at the location, temperature at the location and the wind speed at the location of a power system 10. The local time and date are common to each of the screen areas described below but other information may be displayed also or in addition to the local time and date for example. Three possible menu buttons are displayed which may give three possible usages of the application running on mobile computing system 12 via three menu buttons: a maintenance menu button, an installer's menu button and a monitoring menu. Other buttons may be added, such as the provision of a site management function for example. In the description that follows each of the screen areas may be presented to a user regardless of which of the three buttons is selected. However, each screen area while similar in appearance may present different options to the user depending on which of the three buttons is selected. Access and/or levels of access may also be provided to various areas by use of usernames and passwords for example.

Screen area 51 may include a stage of charge (SOC) area which shows a percentage (%) SOC of storage device 112 which may be used in a power system 10. The percentage (%) SOC of storage device 112 is shown by a cross hatching. Further storage devices 112 used in power system 10 may accessed by pressing a screen button 510. In general, the percentage (%) SOC of storage devices 112 displayed may also serve as separate icons which when touched or swiped by the user allows shows a further detail about a particular storage device 112. The charge/discharge history may be uploaded via data communications module 308 to server 326, either on an ongoing, regular basis or when the user is in proximity to storage device 112 so as to allow uploading a snapshot of the state of charge (SOC) for further data storage and/or analysis.

A charge profile for storage device 112 may be similarly downloaded to local communication device 110 of storage device 112 from server 326. Using the example of a battery for storage device 112, the further detail may include information of battery type, rating in terms of voltage, current and ampere hours (Ah), location of the battery, the number of times the battery has been charged/discharged, the projected battery life of a battery based on its usage. The location of a battery may be established when mobile computing system 12 is in close vicinity to the battery, to assign a GPS co-ordinate to the battery from GPS 310 and/or a unique identification (ID) number to the battery. During installation, the GPS co-ordinate to the battery (or other components of power system 10) and/or a unique identification (ID) number to the battery may be printed out as a bar code which may be applied to the battery housing for example. During maintenance and/or management of power system 10 the ID and GPS co-ordinates may be scanned using camera 312 in order to verify that indeed the battery is the correct one and is in the correct location. A similar cross reference and verification using bar codes on the other components of power system 10 may be made during installation, maintenance and/or management of power system 10.

The further detail provided when icons touched or swiped by the user may also provide a remote mechanisms for a configuration and a control of storage devices 112 via use of respective system power devices 107 for example. The configuration may include the option to disconnect and/or not use a particular battery, the option to designate a battery to have greater priority over the other batteries to be charged first for example, to schedule a battery for replacement based on its current usage, the option to change parameters of a charge profile for a battery or to allow an upload and/or update of a charge profile for a battery.

Screen area 52 may show two loads 109 and indication to a user of the amount of an electrical parameter (e.g. power, voltage and/or current) a load 109 is presently consuming. A press of screen button 520 in screen area 52 may show the consumption of the other loads 109 in power system 10. Each of the two loads 109 displayed may also serve overall as separate icons which when touched or swiped by the user allows shows a further detail about a particular load 109. The detail about a load 109 may include for example a load profile for a particular load 109. The load profile may also include updated information with regards to an updatable load demand history of the power system with reference to daily and nightly demand, weekday demand and monthly demand. The load profile may be updated and/or be configurable via screen area 52 in order control power delivery to loads 109. Options may be provided to possibly disconnect load 109 or to change the voltage and/or currents supplied to load 109 by providing access and control of power devices 103/103a and/or system power devices 107 which may be attached to respective loads 109. Screen area 52 may also include a text area which indicates the total power (Pgen) currently being generated and the amount of power currently being shed (Pshed) or unutilized. Power may be shed since loads 109 and storage devices 112 might not need so much of the power currently being produced by power system 10. The amount of power currently being shed (Pshed) may prompt a user to consider to add additional loads 109 and/or storage devices 112 currently not connected and/or not drawing power. In some embodiments, when power generators (e.g. power sources 101) are capable of producing more power than loads 109 and storage devices 112 can receive, the power generators may be operated as to produce less than a maximum generation capacity, and Pshed may indicate the difference between the maximum generation capacity and the actual generation.

Screen area 53 may show the current power production of strings in graphical format where a maximum possible amount of power (Max) for each string (St 1, St 2, St 3 and St 4) may be shown as a relative scale to each other and the amount of power indicated by the height of a shaded box. The relative scale may be indicative to a user of the possibility of different number, configuration and types of power sources 101 for each of strings St 1, St 2, St 3 and St 4. Wiring configurations 111 may be examples of strings St 1, St 2, St 3 and St 4. The user, when performing maintenance and/or installation, may be able to identify a faulty string and access screen area 55 for example to obtain further details of currents and voltages at various points in a string when located at particular part of power system 10 associated with the string and the components of the string.

In general, an application running on mobile computing system 12 allows a user (e.g. via local communication device 110) to communicate, control, monitor and configure system power devices 107, power devices 103/103*a* and/or storage device(s) 112. By way of example, screen area 55 may provide a further function of utilizing bypass units Q9 in power devices to short and or open circuit portions of a string in order to identify a faulty power device 103/103*a* or power source 101 and or faulty bypass diode connected to power source 101 for example without having to remove electrical covers from the various components of power system 10 and perform electrical diagnosis which may be dangerous and/or time consuming. For example, system maintenance personnel may use an option on screen area 55 to disconnect and/or short circuit power sources 101 one at a time (e.g. by transmitting a signal to a power device 103 to active one or more bypass units Q9 connected to a power source 101, or to operate a switch S1 to disconnect power flow from the power source to the power device), and check if/when disconnecting and/or short circuiting a faulty power source 101 and/or power device 103 causes a string to no longer be faulty.

Screen area 54 may show a panel map of solar panels in relationship to each other and with respect to the compass directions. The solar panels (for power sources 101) and/or module 103/103*a* to which the user is in proximity to is shown shaded to the user on the screen. The user may swipe the screen left and right or up and down to reveal other panels on the map. A press or a swipe of the panel displayed shaded may show further details of the panel, perhaps in a way similar as shown in screen area 55. In screen area 55, the ID number of the panel (ID XX) and the ID of the power device 103 (ID YY) are shown along with the voltages and currents at the various point of connection between panels and power devices 103/103*a*.

Screen area 55 for example allows a user to obtain further details of currents and voltages at various points in a string (e.g. string St 1, St 2, St 3 and St 4 shown in screen area 53) located at particular part of power system 10 associated with the string and the components of the string. The user may swipe screen area 55 left and right or up and down to reveal other parts of a string or other strings. The user when performing maintenance and/or installation may be able to identify a faulty string and access screen area 55 for example to obtain further details of currents and voltages at various points in a string when located at a particular part of power system 10 associated with the string and the components of the string. Screen area 55 may provide a further function of utilizing bypass units Q9 in power devices to short and or open circuit portions of a string in order to identify a faulty power device 103/103*a* or power source 101 for example without having to remove and/or re-attach electrical isolation covers from the various housings of components of power system 10, which may be dangerous (because live contacts are exposed) and time consuming. Reducing the number of times of removing and re-attaching electrical isolation covers from the various housings of electrical isolation covers may additionally help to preserve the integrity of the seals of the electrical isolation covers. Preserving the integrity of the seals of the electrical isolation covers by avoiding unnecessary removal and re-attachment may additionally allow continued protection against the ingress of contaminants such as water and/or dust which may damage internal circuitry of components of power system 10.

Screen area 56 shows a load 109 to which the user is in proximity to is shown shaded to the user on the screen. System power device 107 are shown connected to wiring configurations 111 and one system power device 107 which is connected to storage device 112. Pressing or swiping an element indicating wiring configuration 111 may show further details of wiring configuration 111 as shown in screen area 55. The user may swipe the screen left and right or up and down to reveal other parts of power system 10 for example. Screen area 56 may also serve as a user interface to provide communication, configuration and control of an alternative or additional control function to that of system power device 107 by use of processor 200 for example instead of or in addition to an existing processor of system power device 107.

Electrical installations may deteriorate with age and use and should therefore be inspected and tested at regular intervals to check whether they are in a satisfactory condition for continued use. Safety checks of electrical installations are commonly referred to as a periodic inspection and test. The periodic inspection and test of an installation aims to reveal if any electrical circuits or equipment are overloaded, find any potential electric shock risks and fire hazards, identify any defective electrical work, highlight any lack of earthing or bonding and possibly identify a schedule of circuits in a circuit and their relationship to each other and the presence of adequate identification and notices. Potential Induced Degradation (PID) is an undesirable property of some solar panels. The factors that enable PID (voltage, heat and humidity) may exist for example in a power system 10 which may include solar photovoltaic panels for power sources 101. Monitoring and recording of parameters measured and sensed over a period of time according to features described above and below may provide a testing for susceptibility to PID which may be important in any large-scale power system which may include solar photovoltaic panels. The testing may also determine if the mechanism causing PID is reversible, which may determine whether mitigating measures are required and what measures are appropriate.

The periodic inspection may additionally reveal the extent of any wear and tear, damage or other deterioration, any changes in the use of an installation that have led to, or which may lead to unsafe conditions. The features above mentioned for an established installation may also be included as part of the process of installing a new installation or as part of the maintenance and/or new additions made to existing installations. In the descriptions which follow each of the same screen areas may be presented to a user regardless of selection of which of buttons selected. However, each screen area while similar in appearance may present different options to the user depending on which of the buttons selected. Access and/or levels of access may also be provided to various areas by use of usernames and passwords for example. As such, screen areas 57 and 58 which respectively show screens for a maintenance portal and an installation portal which may share common features and functions.

Screen area 57 shows a screen for a maintenance portal from which a user may select from visual inspection menu 570. Visual inspection menu 570 may provide a check list of tasks and fillable areas by a user to allow the user to report their findings as they go about a visual inspection of an installation. The check list of tasks may help to ensure that an installer or maintenance person has followed all steps, that certified people only are on site and/or to provide in real time or near real time, recoding and monitoring of steps being taken (e.g. for quality, regulatory and/or failure analysis purposes). The items of the visual inspection may include the ID and GPS co-ordinates on a bar code for example which may be scanned using camera 312 in order to cross reference that indeed the item such as a power device 103/103a, system power device 107, power source 101 and storage device 112 are correctly referenced, is in the correct location and correctly referenced to each other in terms of how they are connected to each other. The items of the visual inspection may include the condition of cables and connectors to see if any are damaged by weathering or heat damage due to over currents and/or voltages. In the case where power sources 101 are photovoltaic panels a visual inspection may note how a panel surface may be affected by built-up dust or snow for example. As such, any problems may be recorded and/or reported by selection of a fault menu button 572. The details of a potential fault may further include the possibility of improving the report by taking a photo with camera 312 of any potential along with its ID and/or location for example. If a part of power system 10 is found to be faulty, replacement parts may be reported and ordered via replacement parts menu 574.

Periodic inspection menu 576 may include areas for the testing and inspection of routine maintenance performed and installation performed. Part of periodic inspection menu 576 may scan a barcode/ID which may initiate a check list of tasks for a person performing installation and/or maintenance. The installation and/or maintenance may include a visual inspection and/or possibility of photographic reporting of possible visible faults or damage. Installation and/or maintenance may check that grounding/bonding is in place and allow the recording of electrical test result measurements such as insulation resistance, correct polarity, continuity checks, earth leakage. Installation and/or maintenance may include the test of the effectiveness of residual current devices (RCDs), fuses and isolators to ensure they perform within predefined safety parameters.

Screen area 58 shows a screen for an installers' portal from which a user may select from commissioning menu 580 for example. Commissioning menu 580 may similarly include the features of inspection menu 576 as well as the ability to track progress of items presently being installed in an installation which may be uploaded to server 326. Commissioning menu 580 may for example allow an installer or a maintenance person to place mobile computing system 12 on the surface of a solar panel while the azimuth of the solar panel is measured and/or adjusted. GPS 310 working in conjunction with gyroscope/accelerometer 328 may provide a visual indication on displays 306 and/or 206 as to if the panel has the correct azimuth. The recorded progress of and the features similar to the features of inspection menu 576 may then be used to provide a certification of safe operation of a power system. Items recorded as part of the certification using features of inspection menu 576 may then be used as a comparison at a later stage as part of a subsequent inspection and test of the power system. A real-time help menu 582 may also be provided where an installer or maintenance person can ask technical questions via network 324/server 326 about aspects of a particular component in the power system. A walkie-talkie menu 584 may allow a two-way conversation between personnel performing installation and/or maintenance functions where one of the personnel may be located a distance away and the other may be able to make a quick request to the other to switch something on or off, isolate a circuit, feed a cable or fetch a tool for example.

With screen areas 57 and 58 a provision may be provided to allow online diagnosis of problems and inefficiencies of a power system (e.g. power system 10). The data measured which may be indicative of problems and inefficiencies in a power system may be uploaded via mobile computing system 12 to a person who may be able to provide marketing and/or support advice based on an analysis of the data measured while connected to an installer or maintenance person. The marketing and/or support advice based on the analysis may be for example to encourage the installer or maintenance person to add a storage system by realizing that a lot of power is going unused which may be saved for later usage.

Figure 6A:
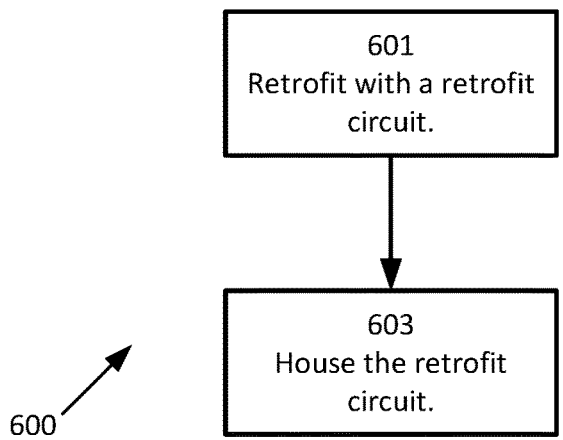
FIG. 6A shows a flowchart of a method and refers again to FIG. 4, according to illustrative aspects of the disclosure.

Reference is made to FIG. 6A which shows a flowchart of a method 600 and again to FIG. 4, according to illustrative aspects of the disclosure. Housing 46 which may house system power device 107 may include data connector 44 which may allow the connection of cable 16 between local communication device 110 and mobile computing system 12. Cable glands 40a and 40b may be used for the insertion and securing of power lines 120 of FIG. 1B (not shown in FIG. 4) for which the conductors of power lines 120 may then be terminated inside housing 46. System power device 107 is shown as a system power device designed for receiving a retrofit communication system. The retrofitting (step 601) may include the attachment, electrical termination and location of local communication device 110 (not shown in FIG. 4) inside housing 46 (step 603) and housing 46 modified to allow display 206 to be mounted on the front panel of housing 46. Display 206 may alternatively be a touch screen mounted on the on the front panel of housing 46 which may provide some of the features of GUI 500 described above. The retrofitting at step 601 may further include the attachment of a data connector 44 which connects to local communication device 110. Alternatively, local communication device 110 may be attached in close proximity or vicinity to system power device 107 or power device 103.

Figure 6B:
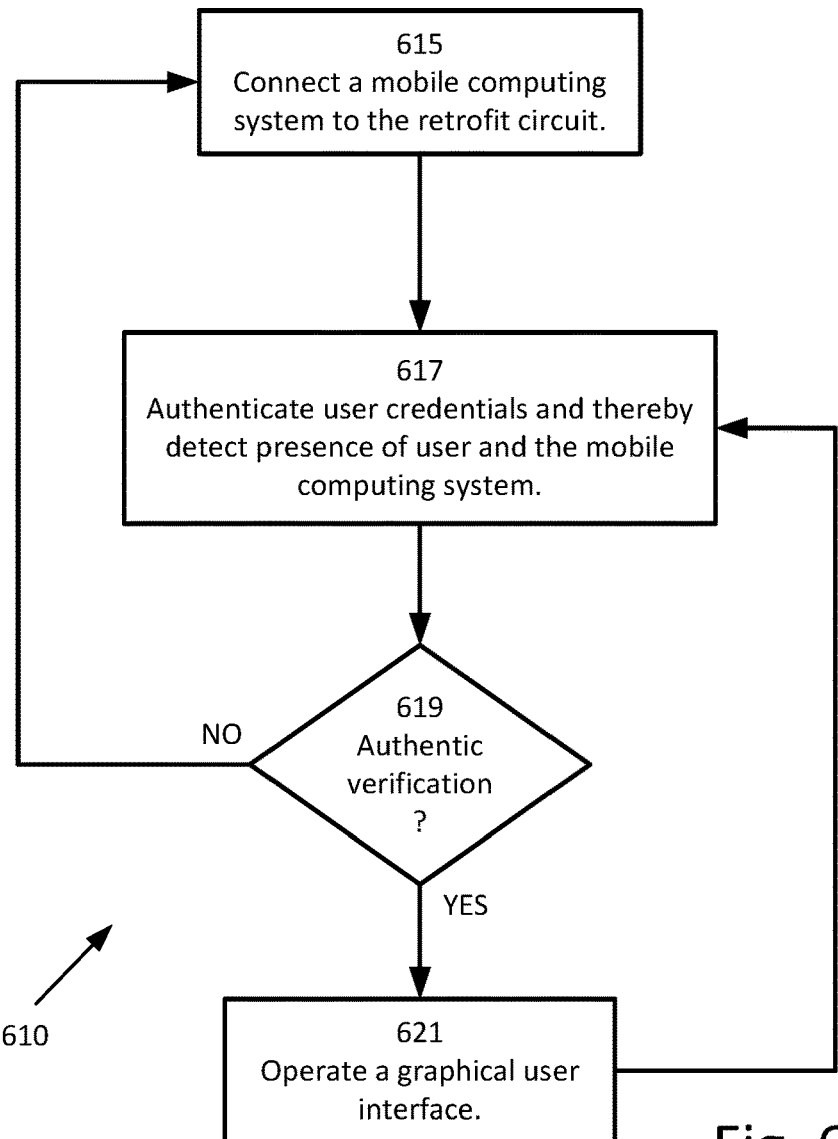
FIG. 6B shows a flowchart of a method, according to illustrative aspects of the disclosure.

Reference is made to FIG. 6B which shows a flowchart of a method 610, according to illustrative aspects of the disclosure. In the description which follows a computer readable medium such as storages 202 and/or 302 may have a program code recorded thereon which may be used for execution mobile computing system 12. Graphical user interface 500 on display 306 and/or displays 206 may be utilized as an input device for a user. The input device may be utilized when the user is in close proximity to power modules 103/103a and system power devices 107.

At step 615, mobile computing system 12 may connect to local communication device 110 which may be retrofit in power modules 103/103a and system power devices 107 according to method 600 described above. Connection to local communication device 110 may be may be via wireless technologies such as Near-field communication (NFC), ZIGBEE™, Wi-Fi, Wireless USB™ and BLUETOOTH™ and or cable 16 for example. Alternatively, a communication device similar to local communication device 110 may already be an integral part of power modules 103/103a and system power devices 107. At step 615 mobile computing system 12 connected to local communication device 110 may be established responsive to when the user and/or the mobile computing system 12 are in close proximity to local communication device 110. When the user and/or the mobile computing system 12 are in close proximity to local communication device 110 at step 617, the credentials of the user may be authenticated. An application running on mobile computing system 12 to provide GUI 500 may request a user name and password from the user or encryption, key management, trusted authority or handshaking that goes on through an interaction between local communication device 110 and mobile computing system 12. Alternatively, the interaction may be between a GUI similar to GUI 500 provided on display 206, similar requests may also include a user name and password from the user and/or that the user is in possession of a smart card which enables the user to operate the GUI provided on display 206.

Therefore, as a result of the interaction of the user at step 617, the presence of the user may be detected and the credentials of the user authenticated at decision step 619. At decision 619, if the credentials of the user and/or mobile computing system 12 is in proximity to local communication device 110 the graphical user interface of local communication device 110 and/or GUI 500 on mobile computing system 12 may be operated at step 621. Otherwise the user may have to try and connect mobile computing system 12 to local communication device 110 or the smart card which may enable the user to operate the GUI provided on display 206 at step 615. If at any point in time the user moves away to break the connection between connect mobile computing system 12 to local communication device 110 at decision 619, the presence of the user may have to be detected again at step 617 and the credentials of the user re-authenticated at decision step 619.

In some cases, a fire department may obtain credentials of authorized users of a power system installed in geographic area(s) that the fire department serves, so that personnel of the fire department may use the GUI running on the personnel's mobile computing system to access and control the power system when an emergency occurs (e.g., a photovoltaic panel catches a fire). In some implementations, the fire department may search a published database, by zipcode(s) of its service area(s), to get the credentials of the authorized users of all the power systems installed within its service area(s). The fire department may search the published database by the address of the power system having an emergency to obtain the credentials of authorized users of the power system. In some other implementations, the owner of the power systems may provide the credentials to the fire department. In some other cases, the fire department may be given, by the owner of the power systems, generic credentials that can be used to access all power systems installed within geographic area(s) that the fire department serves.

Features of operating the GUI provided on display 206 and/or GUI 500 on mobile computing system 12 at step 615 may provide for example an update where necessary to firmware versions of power modules 103/103a and/or system power devices 107 with new firmware versions. As such firmware updates to power modules 103/103a and/or system power devices 107 may be provided from a connection to server 326 provided by the mobile computing system 12 or from storage 302 when a connection to server 326 is not available.

At step 615, for example, the GUI provided on display 206 and/or GUI 500 on mobile computing system 12 may provide a schedule of tasks for a user to follow. The user as they move about a power following the schedule of tasks may provide an upload of data derived from the following of the tasks performed on the power modules 103/103a and/or system power devices 107 to server 326 via the mobile computing system 12. The upload of data may be in the context of the user being in proximity to a particular power module 103/103a and/or system power device 107 so that the data may automatically include the information of the particular power module 103/103a and/or system power device 107. The information may include the firmware version, GPS co-ordinates and unique ID number of the particular power module 103/103a and/or system power device 107.

At step 615, for example, of strings such as strings St 1, St 2, St 3 and St 4 for which wiring configurations 111 may be examples of strings St 1, St 2, St 3 and St 4 may be tested. The testing of strings may be by applying bypass unit Q9 in each string to short-out the output of the series connected power modules 130/103a outputs which form the series string for example. Application of bypass unit Q9 may be as a result of a user moving along a string or the application of each bypass unit Q9 may be conveyed via power line communications through the string to a particular power module 103/103a and/or system power device 107. Application of bypass units Q9 therefore be used to identify potential fault conditions in a series strings for example. A possible testing of a string by use of GUI 500 may be that the testing provides a mitigation of a damage to the housings and the circuits of the power modules 103/103a or system power devices 107 to the environment external to the housings. The damage to the resalable accesses of the housings by going through the reseal-able accesses to inspect and test the circuits of power modules 103/103a or system power devices 107 may therefore be minimized by virtue of the testing using GUI 500.

One or more illustrative aspects of the disclosure herein may include a general-purpose or special-purpose computer system including various computer hardware components, which are discussed in greater detail below. Various embodiments herein may also include computer-readable media for carrying or having computer-executable instructions, computer-readable instructions, or data structures stored thereon. Such computer-readable media may be any available media, which may be accessible by a general-purpose or special-purpose computer system. By way of example, and not limitation, such computer-readable media can include non-transitory computer-readable media. Such computer-readable media can include physical storage media such as RAM, ROM, EPROM, flash disk, CD-ROM or other optical disk storage, magnetic disk storage or other magnetic storage devices, or any other media which can be used to carry or store desired program code mechanisms in the form of computer-executable instructions, computer-readable instructions, or data structures and which may be accessed by a general-purpose or special-purpose computer system.

In this description and in the following claims, a "computer system" may be defined as one or more software or firmware modules, one or more hardware modules, or combinations thereof, which work together to perform operations on electronic data. For example, the definition of computer system may include the hardware components of a personal computer, as well as software or firmware modules, such as the operating system of the personal computer. The physical layout of the modules may be not important. A computer system may include one or more computers connected via a computer network. Likewise, a computer system may include a single physical device (such as a smartphone) where internal modules (such as a memory and processor) work together to perform operations on electronic data. While any computer system may be mobile, the term "mobile computer system" especially may include laptop computers, net-book computers, cellular telephones, smartphones, wireless telephones, personal digital assistants, portable computers with touch sensitive screens and the like.

In this description and in the following claims, a "network" may be defined as any architecture where two or more computer systems may exchange data. The term "network" may include wide area network, Internet local area network, Intranet, wireless networks such as "Wi-Fi", virtual private networks, mobile access network using access point name (APN) and Internet. Exchanged data may be in the form of electrical signals that are meaningful to the two or more computer systems. When data may be transferred, or provided over a network or another communication connection (either hard wired, wireless, or a combination of hard wired or wireless) to a computer system or computer device, the connection may be properly viewed as a computer-readable medium. Thus, any such connection may be properly termed a computer-readable medium. Combinations of the above should also be included within the scope of computer-readable media. Computer-executable instructions include, for example, instructions and data which cause a general-purpose computer system or special-purpose computer system to perform a certain function or group of functions.

The term "server" as used herein, refers to a computer system including a processor, data storage and a network adapter generally configured to provide a service over the computer network. A computer system which receives a service provided by the server may be known as a "client" computer system. The term "data" as used herein refers to a processed analogue signal, the processing including analogue to digital conversion into digital information accessible to a computer system.

It may be noted that various connections are set forth between elements herein. These connections are described in general and, unless specified otherwise, may be direct or indirect; this specification may be not intended to be limiting in this respect. Further, elements of one embodiment may be combined with elements from other embodiments in appropriate combinations or sub-combinations. Examples above have shown how a retrofit circuit such as local communication device 110 applied to power sources 101, power devices 103/103a, system power device 107, storage devices 112 and loads 109 may allow GUI 500 of mobile computing system 12 various function modes which may be useful to a user. The functional modes provided by GUI 500 may be utilized during an installation, maintenance and/or monitoring in the interconnected power system 10 when the user of the GUI 500 is in close proximity to each of the components of power system 10. Features of mobile computing system 12 may allow for firmware updates to components fitted with local communication device 110 and/or another similar communication device. Features of mobile computing system 12 using GUI 500 in close proximity to the components of power system 10 may further allow the monitoring of personnel assigned to perform maintenance or install new installations for example. Firmware updates to components fitted with local communication device 110 and/or another similar communication device may allow for a firmware update from data previously stored in the mobile computing system 12 using GUI 500 and/or from server 326 via network 324 when the user is in close proximity to the components of power system 10. The firmware update from data previously stored in the mobile computing system 12 may be utilized when a connection to and from server 326 via network 324 may not be available. Firmware updates may additionally utilize and interface with existing power line communication between components of power system 10.

Alternatively, or additionally, according to embodiments described above, use of GUI 500 may provide interactive conversation with a support team via text, voice, video streaming, etc. The support team may have access to data and/or support procedures that can be made available to maintenance and/or installation personnel communicating with the support team via GUI 500. According to another feature of one or more embodiments, mobile computing system 12 may obtain an information from power devices 103/103a, system power device 107, storage devices 112 and loads 109 from local communication device 110 or a quick response (QR) code, bar code or another type of label attached to the various components of a power system. The information may allow maintenance and/or installation personnel following a check list of tasks to configure the various components of a power system while moving about and performing tasks to the power system.

Walkie talkie menu 584 may further provide communication for two or more people working the site of a power system. The power system may have inverters (e.g. where system power devices 107 are inverters) in two or more different locations, with one inverter as a master and one or more as slaves. The master may configure all the other inverters via GUI 500. Alternatively, the master inverter may communicate a configuration to the one or more slave inverters by power line communications (PLCs) as an alternative or in addition to mobile computing systems 12 being the gateways. The walkie-talkie menu 584 for example may allow taking configuration data from one mobile computing system 12 and sending it to another mobile computing system 12 directly. Configuration data from one mobile computing system 12 may be transmitted to another mobile computing system 12 via retrofit communication circuits such as local communication device 110, existing communication circuits and/or a combination of retrofit communication circuits, existing communication circuits and power line communications.

Embodiments for local communication device 110 may also be realized to include a power line communication (PLC) device which may be magnetically coupled to power lines, and the magnetic coupling might not require direct electrical connection to the power lines which inter-connect wiring configurations 111 to system power devices 107 and loads 109. The PLC devices may connect to the power cables via clamping mechanism and may enable communications between various parts of power system 10 in order to provide monitoring and control of the various devices within power system 10. The clamping mechanism may also provide a mechanism to power local communication device 110.

All optional and preferred features and modifications of the described embodiments and dependent claims are usable in all aspects of the invention taught herein. Furthermore, the individual features of the dependent claims, as well as all optional and preferred features and modifications of the described embodiments are combinable and interchangeable with one another.

Various features are further described in the following clauses:

Clause 1. An apparatus comprising:
one or more processors connected to a memory and configured to interface to a system power device; and
a communication interface operatively attached to the one or more processors,
wherein the communication interface is adapted to provide a connection to a mobile computing system of a user, and wherein the connection is established responsive to when the user and the mobile computing system are in close proximity to the apparatus and credentials of the user are authenticated.

Clause 2. The apparatus of clause 1, wherein the one or more processors and the communication interface are operatively connected to the system power device.

Clause 3. The apparatus of clause 1, wherein the one or more processors and the communication interface housed in a housing of a system power device is a part of a retrofit to the system power device.

Clause 4. The apparatus of clause 1, wherein the processor and the communication interface are housed in a housing of the system power device.

Clause 5. The apparatus of clause 1, wherein the processor and the communication interface are configured to provide a firmware update of the system power device provided from the mobile computing system attached to a server.

Clause 6. The apparatus of clause 1, wherein the processor and the communication interface are configured to provide an upload of a data from the memory to a server via the mobile computing system.

Clause 7. The apparatus of clause 2, wherein communication interface is configured to assign a Global Positioning System (GPS) co-ordinate to the system power device from the mobile computing system responsive to the mobile computing system being in proximity to the system power device.

Clause 8. The apparatus of clause 3, further comprising: a display operatively attached to the processor and mounted to a surface of a housing of the system power device.

Clause 9. The apparatus of clause 1, further comprising: a sensor and a sensor interface operatively attached between the processor and the system power device, adapted to sense a parameter of the system power device, wherein the parameter is selected from a group of parameters consisting: a voltage, a current, a power, a temperature, an irradiance, coulombic charge.

Clause 10. The apparatus of clause 1, wherein the system power device further comprises: a bypass unit adapted to provide a bypass across an input of the system power device or across an output of the system power device, wherein the bypass is operable from a graphical user interface (GUI) of the mobile computing system.

Clause 11. The apparatus of clause 1, wherein the system power device is a direct current (DC) to alternating current (AC) converter.

Clause 12. The apparatus of clause 1, wherein the system power device is a direct current (DC) to DC converter.

Clause 13. The apparatus of clause 1, wherein the system power device is connected to a charge storage device.

Clause 14. A method comprising:
retrofitting a retrofit circuit, having a) one or more processors, b) a communication interface, and c) a memory, to a system power device, wherein the system power device includes at least one sensor unit and at least one bypass unit operatively connected to the retrofit circuit;
housing the retrofit circuit in a housing of the system power device;
communicatively connecting a mobile computing system to the retrofit circuit, wherein the connecting is established responsive to when a user and the mobile computing system are in close proximity to the retrofit circuit;
authenticating credentials of the user, thereby detecting a presence of the user and the mobile computing device is in close proximity to the retrofit circuit; and
operating a graphical user interface (GUI) of the mobile computing system responsive to the connecting and the authenticating.

Clause 15. The method of clause 14, wherein the operating provides controlling and monitoring of the at least one sensor unit and the at least one bypass unit.

Clause 16. The method of clause 14, wherein the operating prevents unnecessary exposure of live contacts of the system power device by a reseal-able access of the housing being kept closed.

Clause 17. The method of clause 15, wherein the operating provides a mitigation of a damage to the system power device by an exposure of the system power device to an environment external to the housing, wherein the damage is by opening a reseal-able access of the housing, and wherein substantially the controlling and the monitoring minimizes repeated access to the system power device through the reseal-able access.

Clause 18. The method of clause 17, wherein the damage to the system power device is by an exposure of the system power device to the environment external to the housing by a secondary damage to the reseal-able access.

Clause 19. The method of clause 14, wherein the operating provides a firmware update of the system power device from a connection to a server provided by the mobile computing system.

Clause 20. The method of clause 14, wherein the operating comprises:
providing a schedule of tasks; and
following the schedule of tasks and providing an upload of data derived from the following of the tasks performed on the system power device to a server via the mobile computing system.

Clause 21. The method of clause 20, wherein the schedule of tasks for the system power device is selected from a group of schedules consisting: an installation schedule, a maintenance schedule, an operating schedule, an inspection and test schedule.

Clause 22. The method of clause 20, wherein the following of the schedule of tasks by an operative enables monitoring actions of the operative responsive to operative use of the GUI, wherein monitoring data is up-loadable to the server via the mobile computing system.

Clause 23. A power system comprising:
a plurality of power sources coupled to inputs of respective power modules;
a plurality of sensors operatively coupled to both the inputs and outputs of the power modules;
a plurality of bypass circuits operatively coupled to respective outputs of the power modules, wherein the outputs of the power modules are coupled in a series connection to provide a plurality of series connections applied across a plurality of power devices; and
a plurality of communication interfaces operatively attached to both the power modules and the power devices,
wherein the communication interfaces are configured to provide a plurality of communication connections to a mobile computing system of a user, and
wherein the communication connections are established responsive to when the user and the mobile computing system are in close proximity to the power modules or the power devices and an authenticity of the mobile computing system and the user are verified, thereby to detect a presence of the user and the mobile computing device is in close proximity to the power modules and the power devices.

Clause 24. A method of updating, controlling and monitoring an inter-connected power system including a plurality of power sources coupled to inputs of respective power modules, a plurality of sensors operatively coupled to both the inputs and outputs of the power modules, a plurality of bypass circuits operatively coupled to the respective outputs of the power modules, wherein the outputs of the power modules are coupled in a series connection to provide a plurality of series connections applied across the inputs of a plurality of power devices, and a plurality of communication interfaces operatively attached to both the power modules and the power devices, using a graphical user interface (GUI) and a user input from a mobile computing system, the method comprising:

communicatively connecting the mobile computing system to the power modules or power devices detecting thereby a presence of the mobile computing system in a vicinity of the power modules or power devices;

responsive to the detecting, communicating with a user of the mobile computing system, thereby verifying an authenticity of the user;

establishing current firmware versions of the power modules or power devices; and responsive to the establishing, updating when necessary, respective firmware versions of the power modules or power devices with new firmware versions.

Clause 25. The method of clause 24, further comprising: controlling and monitoring of the sensors and the bypass circuits.

Clause 26. The method of clause 24, further comprising: providing firmware updates of the power modules or power devices from a connection to a server provided by the mobile computing system.

Clause 27. The method of clause 24, further comprising: providing a schedule of tasks; and
following the schedule of tasks and providing an upload of data derived from the following of the tasks performed on the power modules or power devices to a server via the mobile computing system.

Clause 28. The method of clause 24, further comprising: testing each of the series connections by applying respective bypass circuits in each of the series connections, thereby potentially identifying a fault condition in each of the series connections.

Clause 29. The method of clause 28, wherein the testing provides a mitigation of a damage to housings of the power modules or power devices and the circuits of the power modules or power devices to an environment external to the housings, wherein the damage is by opening reseal-able accesses of the housings, wherein substantially the testing minimizes repeated access to the power modules or power devices through the reseal-able accesses.

Clause 30. A non-transitory computer readable medium having program code recorded thereon, for execution on a mobile computing system having a graphical user interface and a user input device, to update, control and monitor an inter-connected power system including a plurality of power sources coupled to inputs of respective power modules, a plurality of sensors operatively coupled to both the inputs and outputs of the power modules, a plurality of bypass circuits operatively coupled to the respective outputs of the power modules, wherein the outputs of the power modules are coupled in a series connection to provide a plurality of series connections applied across the inputs of a plurality of power devices, a plurality of communication interfaces operatively attached to both the power modules and the power devices, comprising:

a first program code for communicatively connecting a mobile computing system to the power modules or power devices detecting thereby a presence of the mobile computing system in a vicinity of the power modules or power devices;

a second program code responsive to the detecting, communicating with a user of the mobile computing system, thereby verifying an authenticity of the user;

a third program code of establishing current firmware versions of the power modules or power devices; and a fourth program code responsive to the establishing, updating when necessary, respective firmware versions of the power modules or power devices with new firmware versions.

Clause 31. The non-transitory computer readable medium having program code recorded thereon, for execution on the mobile computing system according to clause 30, further comprising:

a fifth program code of testing each of the series connections by applying respective bypass circuits in each of the series connections, thereby potentially identifying a fault condition in each of the series connections, wherein the testing provides a mitigation of a damage to housings of the power modules or power devices and the circuits of the power modules or power devices to an environment external to the housings, wherein the damage is by opening reseal-able accesses of the housings, and wherein substantially the testing minimizes repeated access to the power modules or power devices through the reseal-able accesses.

Following are examples of the disclosed features.

EXAMPLES

As disclosed herein, aspects of features may reduce the time spent on removal and reclosing of housing covers, reduce the exposure of open live contacts, reduce the wear and tear on the housing seal integrity, and/or the like. For example, a service technician may send configuration instruction for a PV optimizer connected to the underside of a PV panel but issuing reconfiguration commands to the system PV inverter who in turn transfers the commands to the PV optimizer, thus reconfiguring the PV optimizer without opening the housing to connect to an internal digital interface of the PV optimizer located inside the housing.

As disclosed herein, features may allow automatic transfer of data, configurations, software, firmware, and/or the like, between a system power device (such as 107, 103, 103a, and/or the like) when it is not connected to the internet, and a remote server 326 on the internet. This situation may occur for example when a PV inverter is located in a building basement, and the building basement lacks an internet connection available for connection to the inverter. A system power device 107 may be a central PV system inverter, a PV sub-system inverter, a PV converter, a PV optimizer, and/or the like. For example, a PV inverter, converter, or optimizer is installed at an underground location, the inverter, converter, or optimizer comprises an outdated firmware revision, the firmware revision number and configuration setting are automatically transferred to the computerized device (for example, mobile device or mobile terminal) of the installer. When the installer leaves the building, the connection to the inverter is disconnected and the device automatically receives an updated firmware revision and configuration settings. The next time the installer connects to the PV inverter, converter, or optimizer the firmware and configuration settings are automatically updated on the PV inverter. In this example, the inverter, converter, or optimizer may receive the updates from the remote server 326 by using a computerized device (for example, mobile device or mobile terminal) of the installer as an asynchronous data carrier, where the connections may not be established at the same time. For example, being connected to one or the other in a chronologically exclusive manner. When the installer enters the building again, the computerized device may be disconnected from the remote server 326.

As used herein, the term automatically means without user intervention, and may also mean that limited user intervention is required, such as semi-automatically. For example, in some cases an automatic action may require user selection or intervention, such as entering a password, a verification code, a "not a robot" confirmation, and/or the like. These manual operations performed as part of an automatic process, may be done once, periodically, frequently, before/after certain actions, and/or the like. As used herein, the term establish, when used to describe an action resulting in a digital computer connection between components and/or devices, means the initiation of a data connection (for example, a digital connection) which may include a physical connection, a protocol for establishing the connection, a handshaking, an authentication, a verification, a challenge-response, a CAPTCHA (an acronym for Completely Automated Public Turing test to tell Computers and Humans Apart), and/or the like. As used herein, the term processor mean a computerized processor that interprets and executes software (for example, digitally encoded instructions) a configured field programmable gate array (FPGA), a group of digital hardware logic circuits, firmware, program code in memory, and/or the like.

In a further example, a PV inverter may track and/or monitor the actions of a service technician, and installer, and/or the like during their work on a PV system, and transfer the datalog recording the work to a central and/or server 326, such as the server of the manufacturer to monitor warranty violations, such as the server of a maintenance contract company to monitor unauthorized access, such as the server of a maintenance contract company to monitor an employee's activity, and/or the like. For example, the location and/or time of a technician working on a system may be monitored and transferred to a remote server.

As disclosed herein, features may allow remote access to a system power device 107 for receiving data and/or configuration parameters, sending reconfiguration instructions, reconfiguration data, profiles, software, firmware, and/or the like. For example, a remote user may access a system power device 107 to troubleshoot an installation problem, such as a remote expert user, a remote representative of the equipment manufacturer, a remote support team, a back-office support technician, and/or the like. The remote user may want to perform a firmware update, such as when a system power device 107 was shipped to a customer without the latest firmware, with the firmware for a different installation, a different region, a different country, a different language, and/or the like.

Similar, the configuration setting may be updated by a remote user. The remote user may be an onsite user that is prevented (either permanently or temporarily) from accessing the system power device 107, such as a remote system power device, a system power device located in a basement when the user is on the roof, and/or the like. For example, the remote user is an installer on the roof installing PV panels, and the locations of the panels are configured on the system power device 107 using GPS coordinates, physical descriptions, digital video images, digital still images, and/or the like. For example, the remote user is an installer on the roof of a residence, and after completing the installation of a string of PV panels on one side of a roof, may want to reconfigure the PV inverter to separately test the installed string. For example, the installer has installed three or more PV panel strings, and may wish to reconfigure each string by connecting it separately to the PV inverter, and separately testing the string.

The remote user may be within a few meters of the power generating devices, such as the PV panels, on the roof of a building, and may have to travel an access route comprising many meters to reach the PV inverter to update a configuration (such as reconfigure) the PV inverter to test a string of PV panels just installed. For example, the technician is less than 10 meters from the PV panels but over 20 meters distance along the access route to the PV inverter. The user may be less than 4 meters from the furthest PV panel and greater than 6 meters from distance along the access route to the PV inverter. This may allow the user to reconfigure the PV inverter remotely, while monitoring the effects of the reconfiguration by physical inspection.

The physical inspection may be implemented by the physical presence of the user near the power generating devices, while changing the configuration of the system power device 107. The physical presence may include a physical inspection, such as a visual inspection, an auditory inspection, thermal inspection, an olfactory inspection, a tactile inspection, and/or the like. The user may be within a physiological sensory distance (such as between 0 and 20 meters, depending on the sensory type) from the PV panels to allow the inspection during the configuration change, and within data communication interface distance (such as between 0 and 100 meters, depending on the data interface type). For example, during the testing of a string of inverters, the user may smell a burning of isolation when the VP optimizer is connected with reverse polarity, the interconnection has a short, and/or the like. For example, the sound of sparking may alert a user that a reconfiguration is causing a dangerous fire hazard situation, and the user may then send a command to immediately stop the PV inverter operation as a result of the auditory perception.

For example, a PV service technician may isolate and/or troubleshoot a PV system power generation issue by separately connecting each string to the system power device 107, and reconfiguring the system power device for that string, such as when each string comprises a different number of PV panels, different total power, different maximum voltage, and/or the like. In this example, the technician may wish to mix and match PV strings to isolate the problem, such as adding strings, subtracting strings, adding panels, subtracting panels, reconfiguring/repositioning the string wiring 111, and/or the like. The remote access of a technician to the system power device, while working on a power generation device connected to the power device, may increase the installer's safety by reducing the number of times the installer is required to climb a ladder to reconfigure the system power device settings. Thus the installer may remain on the roof, change the wiring 111 of the system, send a reconfiguration request to the PV inverter, and then test the resulting reconfiguration to test the installed system components. When the reconfiguration results in an adverse event, such as sparking, burning, and/or the like, the installer may send a command to the inverter to terminate the adverse event, such as immediately stop drawing power from the PV panels and/or the like.

For example, a walkie-talkie function (as discussed above) on the computerized device (for example, mobile device or mobile terminal) used by a technician allows real-time and automatic connection to a remote support team for assistance with an installation, maintenance, upgrade, and/or the like, of a PV system.

The local connection between a computerized device (for example, mobile device or mobile terminal) and a system power device may be a wired or a wireless connection. For example, the local connection between a computerized device (for example, mobile device or mobile terminal) and a system power device 107 may comprise a Near Field Communication connection, a Short Message Service connection, a BLUETOOTH™ connection, a ZIGBEE™ connection, a WiFi connection, a universal serial bus connection, an Ethernet connection, a general-purpose interface bus connection, a serial connection, a parallel connection, a PLC connection, a point-to-point wireless connection, and/or the like.

Disclosed herein are aspects of a computerized device (for example, mobile device or mobile terminal) for accessing a power generation system. The device may comprise at least one processor (such as at 105, 200, 300, and/or the like), a first communication interface configured to establish a local data connection to an electrical power device 107, a second communication interface configured to establish a remote data connection to a remote server 326, and at least one storage medium, having stored thereon processor instructions. When the processor instructions are executed on the at least one processor, the processor instruction may configure the computerized device to establish the local data connection between the computerized device to the electrical power device 107. The processor instructions may configure the computerized device to receive at least one system status record from the electrical power device 107. The processor instructions may configure the computerized device to establish the remote data connection between the at least one processor to the remote server 326. The processor instructions may configure the computerized device to send the at least one system status record to the remote server.

Here as elsewhere in the specification and claims, ranges can be combined to form new and non-disclosed ranges.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 2-9, it is also envisioned that Parameter X may have other ranges of values within this range, including 2-8, 2.5-3, 4-9, etc.

The present disclosure may be a system, a method, and/or a computer program product at any possible technical detail level of integration. The computer program product may include a computer readable storage medium (or media) having computer readable program instructions thereon for causing a processor (such as at 105, 200, 300, and/or the like) to carry out aspects of the present disclosure, such as transfer data to or from a component of a PV system, update data, software, firmware, and/or the like on a component of the PV system, and/or the like.

Computer readable program instructions described herein can be downloaded to respective computing/processing devices from a computer readable storage medium (such as at 202, 302, and/or the like) or to an external computer or external storage device via a network, for example, the Internet, a local area network, a wide area network and/or a wireless network.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network. In some aspects, electronic circuitry including, for example, programmable logic circuitry, field-programmable gate arrays (FPGA), or programmable logic arrays (PLA) may execute the computer readable program instructions by utilizing state information of the computer readable program instructions to configure the electronic circuitry, in order to perform aspects of the present disclosure.

Aspects of the present disclosure are described herein with reference to flowchart illustrations and/or block diagrams of methods (such as at 600, 610, and/or the like), apparatus (systems), and computer program products according to features of the disclosure. It will be understood that each block of the flowchart illustrations and/or block diagrams, and combinations of blocks in the flowchart illustrations and/or block diagrams, can be implemented by computer readable program instructions.

The flowchart and block diagrams (such as at 600, 610, and/or the like) in the Figures illustrate the architecture, functionality, and operation of possible implementations of systems, methods, and computer program products according to various features of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In the description of various illustrative features, reference is made to the accompanying drawings, which form a part hereof, and in which is shown, by way of illustration, various features in which aspects of the disclosure may be practiced. It is to be understood that other features may be utilized and structural and functional modifications may be made, without departing from the scope of the present disclosure.

It may be noted that various connections are set forth between elements herein. These connections are described in general and, unless specified otherwise, may be direct or indirect; this specification may be not intended to be limiting in this respect. Further, elements of one feature may be combined with elements from other features in appropriate combinations or sub-combinations.

All optional and preferred features and modifications of the described features and dependent claims are usable in all aspects of the features taught herein. Furthermore, the individual features of the dependent claims, as well as all optional and preferred features and modifications of the described features are combinable and interchangeable with one another.

Various features are further described in the following additional clauses:

Clause 32. A computerized device for accessing a power generation system, comprising: at least one processor, a first communication interface configured to establish a local data connection to an electrical power device; a second communication interface configured to establish a remote data connection to a remote server; and at least one storage medium, having stored thereon processor instructions that, when executed on the at least one processor, configure the computerized device to: establish the local data connection between the computerized device and the electrical power device, receive at least one system status record from the electrical power device, establish the remote data connection between the at least one processor and the remote server, and send the at least one system status record to the remote server.

Clause 33. A computer program product comprising a non-transitory computer-readable storage medium having stored thereon processor instructions for accessing a power generation system that, when executed by at least one processor, configure the at least one processor to: establish a local data connection, using a first communication interface, between the at least one processor and an electrical power device; receive, by the at least one processor, at least one system status record from the electrical power device establish a remote data connection, using a second communication interface, between the at least one processor and a remote server; and send, from the at least one processor, the at least one system status record to the remote server.

Clause 34. A method of accessing a power generation system, the method comprising: establishing a local data connection, using a first communication interface, between a computerized device and an electrical power device; receiving, by the computerized device, at least one system status record from the electrical power device establishing a remote data connection, using a second communication interface, between the computerized device and a remote server; and sending, from the computerized device, the at least one system status record to the remote server.

Clause 35. An electrical power device for accessing a power generation system comprising: at least one processor; a communication interface configured to establish a local data connection to a client terminal; and at least one storage medium, having stored thereon processor instruction that configure the electrical power device to: establish the local data connection with the client terminal, and send at least one system status record to the client terminal.

Clause 36. A method of accessing a power generation system, the method comprising: establishing, with an electrical power device, a local data connection with a client terminal, and sending, from the electrical power device via the local data connection, at least one system status record to the client terminal.

Clause 37. The computerized device, electrical power device, computer program product, or methods of any one of the preceding clauses, wherein the at least one system status record comprises at least one configuration version, and wherein the processor instructions, when executed, further configure the computerized device or electrical power device to: receive at least one configuration update from the remote server responsive to the at least one configuration version; and send to the electrical power device the at least one configuration update.

Clause 38. The computerized device, electrical power device, computer program product, or methods of clause 37, wherein the at least one configuration update comprises a firmware update or a configuration dataset.

Clause 39. The computerized device, electrical power device, computer program product, or methods of clauses 37 or 38, wherein the at least one configuration version represents/is indicative of/is associated with/determines a configuration of at least one component of a photovoltaic system, wherein the photovoltaic system components comprise the electrical power device, a photovoltaic power inverter, a photovoltaic power optimizer, or a photovoltaic power converter.

Clause 40. The computerized device, electrical power device, computer program product, or methods of any one of the preceding clauses, wherein the at least one system status record comprises an authorized access log, an un-authorized access log, a unique identification (ID) number, a global positioning system co-ordinate data, a user name, a password, an encryption key, a record of an updated firmware version, a record of a previous or current firmware version, or an error log.

Clause 41. The computerized device, electrical power device, computer program product, or methods of any one of the preceding clauses, wherein the methods further comprise, or the processor instructions, when executed, further configure the device to: disconnect(ing) the local or remote data connections.

Clause 42. The computerized device, electrical power device, computer program product, or methods of any one of the preceding clauses, wherein the receiving at least one system status record from the electrical power device, and sending the at least one system status record to the remote server are performed sequentially or asynchronously, such as not at the same time.

Clause 43. The computerized device, electrical power device, computer program product, or methods of any one of the preceding clauses, wherein the electrical power device is configured to, or perform, input(ing) electrical direct current power from at least one photovoltaic power generator and configured to output electrical direct current power to a second electrical power device or alternating current power to an electrical grid.

Clause 44. The computerized device, electrical power device, computer program product, or methods of any one of the preceding clauses, wherein the at least one system status record comprises a photovoltaic system information indicative of an aspect of a photovoltaic power generation system, including an authorized access log indicative of at least one authorized maintenance action on the photovoltaic power generation system, an un-authorized access log indicative of at least one un-authorized maintenance action on the photovoltaic power generation system, a record of an updated firmware version indicative of a firmware version of a component of the photovoltaic power generation system, a record of a previous or current firmware version indicative of a previous or current firmware version of a component of the photovoltaic power generation system, or an error log indicative of at least one failure of at least one component of the photovoltaic power generation system.

Clause 45. A computerized device comprising: at least one processor: a data communication interface configured to transmit digital data to an electrical power device; a user interface configured to receive user commands; and a computer-readable storage medium having stored thereon processor instructions that, when executed on the at least one processor, configure the computerized device to: establish a data connection to the electrical power device using the data communication interface, receive a user command identifying a configuration or operation of the electrical power device or at least one of a plurality of power generators connected the electrical power device, and send the user command to the electrical power device using the data communication interface.

Clause 46. A method comprising: establishing, by a computerized device, a data connection to an electrical power device using a data communication interface; receiving, by the computerized device, a user command identifying a configuration or operation of the electrical power device or at least one of a plurality of power generators connected the electrical power device; and sending the user command to the electrical power device using the data communication interface.

Clause 47. An electrical power device comprising: at least one processor; an electrical power input configured to receive power from a plurality of power generators, a data communication interface configured to receive data from a computerized device; and a storage medium having stored thereon processor instructions that, when executed on the at least one processor, configure the electrical power device to: establish a data connection to the computerized device using the data communication interface; receive, via the data communication interface, a user command identifying a configuration or operation of the electrical power device or at least one of the plurality of power generators; and initiate actions, based on or identified by the user command, on the electrical power device or at least one of the plurality of power generators.

Clause 48. A method comprising: establishing, by an electrical power device, a data connection to a computerized device using a data communication interface; receiving, by the electrical power device via the data communication interface, a user command identifying a configuration or operation of the electrical power device or at least one of the plurality of power generators; and initiating, by the electrical power device, actions, based on or identified by the user command, on the electrical power device or at least one of the plurality of power generators.

Clause 49. A power generation system comprising: a plurality of power generators; and an electrical power device configured to receive electrical power from at least one of the plurality of power generators using the at least one respective interconnection, wherein the electrical power device comprises a data communication interface, and wherein the data communication interface is configured to receive a user command identifying a configuration or operation of the electrical power device or at least one of the plurality of power generators, and wherein subsequent to receiving the user command the electrical power device initiates actions, based on or identified by the user command, on the electrical power device or at least one of the plurality of power generators.

Clause 50. The methods, computerized device, electrical power device, or power generation system of any one of clauses 45 through 49, wherein the user command identifies: an electronic activation operation; a data value of an electrical voltage, an electrical current, an electrical power, an electrical component operating temperature, or a state-of-charge of an energy storage device; a data value configuration comprising a plurality of data values, wherein the data value configuration represents a set of system electrical parameters, a set of loads connected to an electrical distribution panel, or a charging profile of an electrical energy storing device; a software configuration of a central power computerized device; a firmware configuration of a component of a photovoltaic power generation system; an electrical configuration of a component of a photovoltaic power generation system; or a selection of a status comprising a status of a failure of, a service to, or a performance of, a component of a photovoltaic power generation system: and wherein the user command applies to the electrical power device or at least one of the plurality of power generators.

Clause 51. The methods, computerized device, electrical power device, or power generation system of any one of clauses 45 through 50, wherein the plurality of power generators comprise a plurality of respective interconnections, and wherein the user command identifies a wiring selection of one or more of a plurality of wiring configurations of the plurality of respective interconnections, and wherein the user command applies to the electrical power device or at least one of the plurality of power generators.

Clause 52. The methods, computerized device, electrical power device, or power generation system of clause 51, wherein the wiring selection: identifies a subset of the one or more power generators that are operationally connected to the power device, identifies a configuration of the electrical power device to receive the power, or includes instructions to control the electrical power device or at least one of the plurality of power generators.

Clause 53. The methods, computerized device, electrical power device, or power generation system of any one of clauses 45 through 52, wherein the electrical power device and the plurality of power generators are components of a photovoltaic power generation system.

Clause 54. The methods, computerized device, electrical power device, or power generation system of clause 53, wherein the photovoltaic power generation system further comprises at least one photovoltaic power inverter, at least one photovoltaic power optimizer, or at least one photovoltaic power converter.

Clause 55. The methods, computerized device, electrical power device, or power generation system any one of clauses 45 through 54, wherein the user command is sent in response to the configuration or operation of the electrical power device or at least one of the plurality of the plurality of power generators, and (or) wherein the user command identifies the results of a visual inspection, an auditory inspection, or an olfactory inspection of at least one of the plurality of power generators.

Clause 56. The methods, computerized device, electrical power device, or power generation system of any one of clauses 45 through 55, wherein the computerized device is in close proximity to at least one of the plurality of power generators.

Clause 57. The methods, computerized device, electrical power device, or power generation system of any one of clauses 45 through 56, wherein the computerized device is in remote proximity to the electrical power device.

Clause 58. The methods, computerized device, electrical power device, or power generation system any one of clauses 56 through 57, wherein the close proximity is less than 4 meters linear distance.

Clause 59. The methods, computerized device, electrical power device, or power generation system any one of clauses 56 through 58, wherein the remote proximity is greater than 6 meters route of access distance.

Clause 60. The methods, computerized device, electrical power device, or power generation system of any preceding clauses, wherein the computerized device comprises a mobile terminal.

The invention claimed is:

1. An apparatus comprising:
a mobile device configured to communicate with a photovoltaic (PV) system, wherein the mobile device comprises:
at least one processor; and
memory storing processor instructions that, when executed by the at least one processor, cause the mobile device to:
establish a data connection, via a first interface, with a direct current to alternating current (DC-to-AC) converter of the PV system;
display, via a second interface, information associated with the PV system;
based on the displayed information, send, to the DC-to-AC converter via the first interface, an update; and
cause the DC-to-AC converter to send the update to at least one remote DC-to-DC power converter via the first interface using a power line communication (PLC) link between the DC-to-AC converter and the at least one remote DC-to-DC power converter, wherein the at least one remote DC-to-DC power converter is located remotely to the mobile device.

2. The apparatus of claim 1, wherein the update comprises at least one of:
a command to update an operational status of the at least one remote DC-to-DC power converter,
a configuration dataset configured for installation on the at least one remote DC-to-DC power converter, or
a firmware version configured for installation on the at least one remote DC-to-DC power converter.

3. The apparatus of claim 1, wherein the processor instructions, when executed on the at least one processor, configure the mobile device to receive, from the DC-to-AC converter, a log of errors associated with the DC-to-AC converter and the at least one remote DC-to-DC power converter.

4. The apparatus of claim 1, wherein the processor instructions, when executed on the at least one processor, configure the mobile device to:
determine, using a geographical positioning system, coordinates of a geographic location of the mobile device; and
assign the coordinates to a geographic location of the DC-to-AC converter.

5. The apparatus of claim 1, wherein the first interface is configured to directly communicate with a system electrical power device associated with the DC-to-AC converter, and the processor instructions, when executed on the at least one processor, configure the mobile device to display, via the second interface, the information comprising an identification of the system electrical power device.

6. The apparatus of claim 1, wherein the processor instructions, when executed on the at least one processor, configure the mobile device to:
display, via the second interface, the information to assist management of the DC-to-AC converter, wherein the information comprises at least one of a voltage, a current, a power, or an operational status.

7. The apparatus of claim 1, wherein the update is received from a remote internet-connected server via a third interface different from the first interface and the second interface, wherein the update is configured for the at least one remote DC-to-DC power converter connected to the DC-to-AC converter.

8. A photovoltaic (PV) system comprising:
a plurality of remote direct current to direct current (DC-to-DC) power converters;
a plurality of PV power generators, wherein each PV power generator provides power using a respective one of the plurality of remote DC-to-DC power converters;
a direct current to alternating current (DC-to-AC) converter configured to receive electrical power from the plurality of remote DC-to-DC power converters;
a system electrical power device associated with the DC-to-AC converter; and
a mobile device comprising:
at least one processor; and
memory storing processor instructions that, when executed by the at least one processor, cause the mobile device to:
establish a data connection, via a first interface, with the DC-to-AC converter;
display, via a second interface, information associated with the DC-to-AC converter;
based on the displayed information, send, to the DC-to-AC converter via the first interface, an update; and
cause the DC-to-AC converter to send the update to at least one remote DC-to-DC power converter of the plurality of remote DC-to-DC power converters via the first interface using a power line communication (PLC) link between the DC-to-AC converter and the at least one remote DC-to-DC power converter of the plurality of remote DC-to-DC power converters.

9. The PV system of claim 8, wherein the processor instructions, when executed on the at least one processor, configure the mobile device to:
determine, using a geographical positioning system, coordinates of a geographic location of the mobile device; and
assign the coordinates to a geographic location of the DC-to-AC converter.

10. The PV system of claim 8, wherein the update comprises at least one of:
a command to update an operational status of the at least one remote DC-to-DC power converter,
a firmware version, received previously from a remote internet-connected server, for the at least one remote DC-to-DC power converter, and wherein the DC-to- AC converter is configured to install at least one firmware version on the at least one remote DC-to-DC power converter, and a configuration dataset for the at least one remote DC-to-DC power converter, and wherein the DC-to-AC converter is configured to install the configuration dataset on the at least one remote DC-to-DC power converter.

11. The PV system of claim 8, wherein the first interface is configured to directly communicate with the system electrical power device, and the processor instructions, when executed on the at least one processor, configure the mobile device to display, via the second interface, the information comprising an identification of the system electrical power device.

12. The PV system of claim 8, wherein the processor instructions, when executed on the at least one processor, configure the mobile device to display, via the second interface, the information to assist management of the DC-to-AC converter, wherein the information comprises at least one of a voltage, a current, a power, or an operational status.

13. A method for a photovoltaic (PV) system, the method comprising:

establishing, by a mobile device and via a first interface, a data connection with a direct current to alternating current (DC-to-AC) converter of the PV system;

displaying, via a second interface, an identification of the DC-to-AC converter;

based on the displaying, sending, to the DC-to-AC converter via the first interface, an update; and causing the DC-to-AC converter to send the update to at least one of a plurality of remote DC-to-DC power converters via the first interface using a power line communication (PLC) link between the DC-to-AC converter and the at least one of the plurality of remote DC-to-DC power converters, wherein the at least one of the plurality of remote DC-to-DC power converters is located remotely to the mobile device.

14. The method of claim 13, wherein the update comprises at least one of:

a command to update an operational status of the at least one of the plurality of remote DC-to-DC power converters, a configuration dataset configured for installation on the at least one of the plurality of remote DC-to-DC power converters, and at least one firmware version configured for installation on the at least one of the plurality of remote DC-to-DC power converters.

15. The method of claim 13, further comprising receiving the update, from a remote internet-connected server via a third interface different from the first interface and the second interface, for the at least one of the plurality of remote DC-to-DC power converters connected to the DC-to-AC converter.

16. The method of claim 13, further comprising:

determining, using a geographical positioning system, coordinates of a geographic location of the mobile device; and assigning the coordinates to a geographic location to the DC-to-AC converter.

17. The method of claim 13, further comprising:

directly communicating with a system electrical power device of the PV system.

18. The method of claim 13, further comprising:

displaying, via the second interface, an identification of a system electrical power device of the PV system.

19. The method of claim 13, further comprising displaying, via the second interface, information to assist management of the PV system, wherein the information comprises at least one of a voltage, a current, a power, or an operational status.

20. The method of claim 13, further comprising receiving, from the DC-to-AC converter, a log of errors associated with the DC-to-AC converter and the at least one of the plurality of remote DC-to-DC power converters.

* * * * *